(12) United States Patent
Takasaki et al.

(10) Patent No.: US 6,544,720 B2
(45) Date of Patent: *Apr. 8, 2003

(54) PHOTOSENSITIVE COMPOSITION, IMAGE-FORMING MATERIAL AND IMAGE-FORMING METHOD EMPLOYING IT

(75) Inventors: Ryuichiro Takasaki, Kanagawa (JP); Toshiyuki Urano, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/739,272

(22) Filed: Dec. 19, 2000

(65) Prior Publication Data

US 2001/0007736 A1 Jul. 12, 2001

Related U.S. Application Data

(63) Continuation of application No. 09/412,979, filed on Oct. 6, 1999, now Pat. No. 6,232,038.

(30) Foreign Application Priority Data

| Oct. 7, 1998 | (JP) | 10-285043 |
| Oct. 15, 1998 | (JP) | 10-293400 |
| Dec. 25, 1998 | (JP) | 10-370218 |
| Dec. 25, 1998 | (JP) | 10-370219 |
| Feb. 19, 1999 | (JP) | 11-41667 |

(51) Int. Cl.$^7$ .................. G03G 1/73; G03G 1/735; G03G 1/77; G03G 5/16; G03F 7/029; G03F 7/30
(52) U.S. Cl. .............. 430/281.1; 430/278.1; 430/271.1; 430/280.1; 430/284.1; 430/285.1; 430/287.1; 430/302; 430/306; 430/325; 430/905; 430/910; 430/916; 430/925; 430/926; 430/944; 430/945
(58) Field of Search .............. 430/281.1, 287.1, 430/285.1, 280.1, 284.1, 271.1, 278.1, 325, 306, 302, 925, 926, 916, 910, 944, 905, 945

(56) References Cited

U.S. PATENT DOCUMENTS

| 4,584,235 A | * | 4/1986 | Roberts et al. ............. 428/333 |
| 5,681,685 A | * | 10/1997 | Yamaoka et al. ......... 430/281.1 |
| 6,124,379 A | * | 9/2000 | Chobert et al. ............. 523/333 |
| 6,232,038 B1 | * | 5/2001 | Takasaki et al. ......... 430/281.1 |
| 6,280,890 B1 | * | 8/2001 | Sawamura et al. ............ 430/7 |

FOREIGN PATENT DOCUMENTS

| EP | 0 763 779 A2 | * | 3/1997 |
| EP | 0 780 731 A2 | * | 6/1997 |
| EP | 0 833 203 A1 | * | 4/1998 |
| JP | 49-5047 | * | 1/1974 |
| JP | 5-222301 | * | 8/1993 |

OTHER PUBLICATIONS

STN Database Search for the Chemical Structure of "Pigment Green 36" (File; Registry).*
STN Database Search for the Chemical Structure of Copper Phthalocyanme or Pigment Blue 15:6 (File; Registry).*
Partial machine–assisted English translation of JP 5–222301 provided by Japan Patent Office.*
Derwent abstract 1974–33529V—English abstract for Jp 49–5047.*
U.S. patent application Ser. No. 09/837,655, filed Apr. 19, 2001, pending, 204557US0.
U.S. patent application Ser. No. 09/739,272, filed Dec. 19, 2000, pending, 199732US0 Cont*.

* cited by examiner

*Primary Examiner*—Janet Baxter
*Assistant Examiner*—Sin J. Lu
(74) *Attorney, Agent, or Firm*—Oblon, Spivak, McClelland, Maier & Neustadt, P.C.

(57) ABSTRACT

A photosensitive composition comprising (a) an ethylenically unsaturated double bond-containing compound, (b) a sensitizing dye and (c) a photopolymerization initiator, wherein the sensitizing dye is a phthalocyanine compound showing the maximum absorption within a range of from 750 to 1,200 nm.

22 Claims, No Drawings

US 6,544,720 B2

PHOTOSENSITIVE COMPOSITION, IMAGE-FORMING MATERIAL AND IMAGE-FORMING METHOD EMPLOYING IT

This application is a Continuation of application Ser. No. 09/412,979 Filed on Oct. 6, 1999, now U.S. Pat. No. 6,232,038.

BACKGROUND OF THE INVENTION

1. Field of the Invention

The present invention relates to a photosensitive composition which is useful for fine processing of e.g. lithographic printing plates, printed boards, LSI, TFT liquid crystal display devices, plasma display devices and TAB, and it further relates to an image-forming material, a photosensitive lithographic printing plate and an image-forming method. More particularly, it relates to a negative photosensitive resin composition which is useful for direct image-forming by laser scanning exposure based on digital signals of computers, etc. and which is suitable for exposure with an infrared laser such as a semiconductor laser or a solid state laser.

2. Discussion of Background

Lithographic technology employing a photosensitive resin has been widely used for fine processing of printed boards, LSI, TFT liquid crystal display devices, plasma display devices, TAB, etc. for image formation. For such a purpose, it is common to employ a method wherein image exposure is carried out through a mask, and a pattern is formed by utilizing the difference in solubility to a developer between an exposed portion and a non-exposed portion. If a laser beam is employed, a photosensitive resin can be directly scanned for image exposure based on digital information of a computer or the like, whereby not only the productivity but also the resolution, the positional precision, etc., can be improved. Accordingly, a direct image-forming method by a laser is being studied extensively.

As the laser beam, various light sources are known ranging from far ultraviolet rays to microwaves. However, a laser beam useful for lithography from the viewpoint of the laser power, stability, costs, sensitizing ability, etc., is preferably one which emits visible light to infrared light, such as an Ar ion laser, a YAG laser, a helium neon laser or a semiconductor laser. Accordingly, various compositions having photosensitivities within a range of from visible light to infrared light, are being studied.

Among them, a positive photosensitive composition utilizing a phase change of a novolak resin (JP-A-9-43847) is known as a composition which is selectively sensitive to infrared light and has a safe light property against white light, and, as a composition utilizing a thermal reaction by a photo-thermal conversion substance, one utilizing crosslinking of a block isocyanate (JP-A-6-1088, and JP-A-9-43845) or one utilizing a phenolic crosslinking agent (JP-A-8-276558) is known. However, such compositions have had a problem from the viewpoint of the sensitivity and stability.

Further, JP-A-62-143044 and JP-A-62-150242 disclose photosensitive compositions comprising an ethylenic monomer, an organic boron complex and a cation dye. However, the photosensitive compositions disclosed in these publications are sensitive to light in a visible to near infrared region and thus have had a problem in handling under white light.

On the other hand, JP-A-6-175564 discloses a hologram recording material comprising a polymer compound which is a (co)polymer of a vinyl monomer, a compound having at least one ethylenically unsaturated bond, a porphyrazine derivative including a phthalocyanine compound and a sulfonium organic boron complex, and specifically describes an example wherein hologram recording was carried out with a light having a wavelength of from 633 to 647 nm.

SUMMARY OF THE INVENTION

Under these circumstances, it is an object of the present invention to provide a photosensitive resin composition for direct image forming by a laser, which 1) has a high sensitivity to a laser beam emitting infrared light, 2) can easily be handled under white light without requiring any special environment such as a red light lamp, 3) can be developed with an aqueous alkali solution, and 4) is excellent in the stability of the photosensitive liquid or in the stability of an image-forming material having a layer made of such a photosensitive composition, and to provide an image-forming material and an image-forming method.

Another object of the present invention is to provide a photosensitive lithographic printing plate excellent in the printing properties such as the adhesion and the chemical resistance.

As a result of an extensive study, the present inventors have found that a combination of a photopolymerization initiator and a phthalocyanine compound showing the maximum absorption at a specific wavelength exhibits a photosensitivity which is selectively high only to infrared light and thus can be safely handled under white light.

Further, it has been found that when stored as a photosensitive liquid, such a combination is stable without any particular change such as precipitation and can be developed with an aqueous alkali solution to form an image.

Namely, the present invention provides a photosensitive composition comprising (a) an ethylenically unsaturated double bond-containing compound, (b) a sensitizing dye and (c) a photopolymerization initiator, wherein the sensitizing dye is a phthalocyanine compound showing the maximum absorption within a range of from 750 to 1,200 nm.

Further, the present invention provides an image-forming material comprising a substrate and a photosensitive layer made of the photosensitive composition, formed on the substrate.

Still further, the present invention provides an image-forming method which comprises subjecting the image-forming material to exposure with an infrared laser having a wavelength within a range of from 780 to 1,200 nm, followed by development with an alkali developer to remove unexposed portions.

DETAILED DESCRIPTION OF THE PREFERRED EMBODIMENTS

Now, the preferred embodiments of the present invention will be described in detail.

(a) Ethylenically Unsaturated Double Bond-Containing Compound (Hereinafter Referred to as "Ethylenically Unsaturated Compound")

The ethylenically unsaturated compound may be a compound having at least one polymerizable unsaturated double bond in its molecule. Various known unsaturated compounds may be used. Among them, particularly preferred is a low molecular weight compound having at least two double bonds in the molecule, a so-called acryl monomer, from the viewpoint of the crosslinking efficiency, change in solubility, etc. The acryl monomer will be described in detail hereinafter, but, from the viewpoint of the sensitivity, one having at least four double bonds in its molecule, is particularly preferred. In the present invention, the acryl monomer includes a methacryl monomer. The molecular weight of the low molecular weight compound is usually at most 2,000, preferably at most 1,000. The lower limit is not particularly limited, but it is usually at least 20.

The acryl monomer may, for example, be an ester acrylate compound having an unsaturated carboxylic acid condensed with an aliphatic alcohol or with an aromatic hydroxyl compound, an epoxy acrylate compound having an unsaturated carboxylic acid added to an aliphatic or aromatic epoxy compound, a urethane acrylate compound having an unsaturated hydroxy compound added to an isocyanate compound, an acryloyloxyalkyl group-containing amine compound, or an acryloyloxyalkyl group-containing phosphate compound. However, the acryl monomer is not limited to such specific examples.

The ester acrylate compound may, for example, be 1,4-butanediol di(meth)acrylate, 1,6-hexanediol di(meth)acrylate, 1,9-nonanediol di(meth)acrylate, neopentyl glycol di(meth)acrylate, tetraethylene glycol di(meth)acrylate, tripropylene glycol di(meth)acrylate, propylene glycol di(meth)acrylate, glycerol methacrylate(meth)acrylate, trimethylolpropane di(meth)acrylate, trimethylolpropane tri(meth)acrylate, pentaerythritol di(meth)acrylate, pentaerythritol tri(meth)acrylate, pentaerythritol tetra(meth)acrylate, trimethylolpropane ethyleneoxide-added tri(meth)acrylate, glycerolpropylene oxide-added tri(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexaacrylate, sorbitol tetra(meth)acrylate, sorbitol penta(meth)acrylate, sorbitol hexa(meth)acrylate, a di(meth)acrylate of tris(2-hydroxyethyl)isocyanurate, or a tri(meth)acrylate of tris(2-hydroxyethyl)isocyanurate.

The epoxyacrylate compound may be a compound having an α,β-unsaturated carboxylic acid reacted by addition reaction to an epoxy compound having an epoxy ring such as a glycidyl group or an alicyclic epoxy group.

The epoxy compound may be various epoxy compounds wherein the basic structure having an epoxy ring may be an aliphatic, aromatic, heterocyclic or mixed structure. The aromatic epoxy compound may, for example, be a phenol novolak epoxy compound, a (o,m,p)-cresol novolak epoxy compound, a bisphenol-A epoxy compound, bisphenol-F epoxy compound or a halogenated epoxy compound such as a brominated phenol novolak epoxy compound. Such compounds may be low molecular weight compounds, or oligomers or polymers in the form of resins.

The aliphatic epoxy compound may, for example, be sorbitol polyglycidyl ether, sorbitan polyglycidyl ether, (poly)glycerol polyglycidyl ether, trimethylol propane polyglycidyl ether, neopentyl glycidyl ether, hexanediol diglycidyl ether, (poly)ethylene glycol diglycidyl ether, (poly)propylene glycol diglycidyl ether, (poly)tetramethylene glycol diglycidyl ether, or (poly)pentamethylene glycol diglycidyl ether.

The epoxy compound having a heterocyclic structure may, for example, be triglycidyl isocyanurate or triglycidyl tris(2-hydroxyethyl) isocyanurate.

The alicyclic epoxy compound may, for example, be EPOLEAD GT300 or GT400, or CEROXIDE 2021, 2080, 3000 or 2000, manufactured by Daicel Chemical Industries, Ltd.

An epoxy acrylate compound is preferably employed which is obtained by adding to the above-mentioned epoxy compound an α,β-unsaturated carboxylic acid such as (meth)acrylic acid in the presence of e.g. a quaternary ammonium salt as a catalyst. Further, a modified epoxy acrylate may also be preferably employed which is obtained by further modifying the epoxy acrylate compound with e.g. an acid anhydride such as maleic anhydride or tetrahydrophthalic anhydride.

The urethane acrylate compound may be a compound obtained by reacting a compound having at least two isocyanate groups in its molecule, e.g. an aroamtic diisocyanate such as p-phenylene diisocyanate, 2,4-tolylene diisocyanate, 2,6-tolyelene diisocyanate, 4,4'-diphenylmethane diisocyanate, naphthalene-1,5-diisocyanate or tolydine diisocyanate, an aliphatic diisocyanate such as hexamethylene diisocyanate, lysinemethyl ester diisocyanate, 2,4,4-trimethylhexamethylene diisocyanate or dimer acid diisocyanate, an alicyclic diisocyanate such as isophorone diisocyanate, 4,4'-methylenebis(cyclohexylisocyanate), or ω,ω'-diisocyanate dimethylcyclohexane, an aliphatic diisocyanate having an aromatic ring, such as xylylene, diisocyanate or α, α, α', α'-tetramethylxylylene diisocyanate, or a triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) or tris(isocyanatephenyl)thiophosphate, with an acryl compound having a hydroxyl group, such as hydroxymethyl (meth)acrylate, hydroxyethyl (meth)acrylate, pentaerythritol tri(meth)acrylate, dipentaerythritol pentaacrylate, 2-hydroxy-3-acryloyloxypropyl (meth)acrylate, ditrimethylolpropane tri(meth)acrylate, isocyanuric acid alkyleneoxide-modified di(meth)acrylate or pentaerythritol di(meth)acrylate monostearate.

The following may be mentioned as specific examples of the urethane (meth)acrylate.

M-1

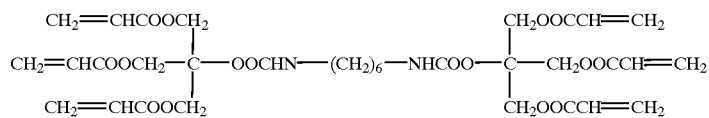

M-2

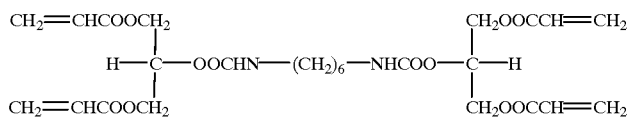

M-3
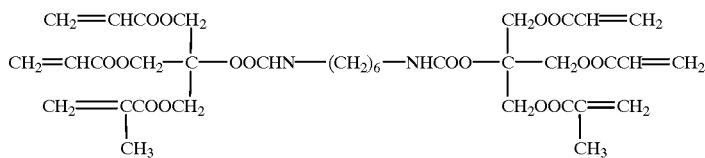
M-4
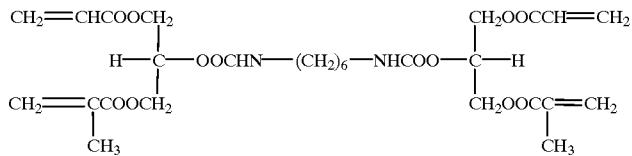
M-5
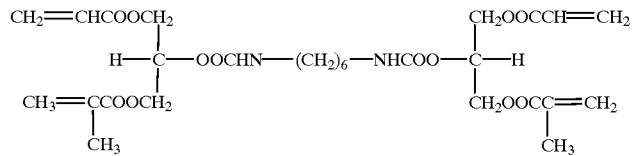
M-6
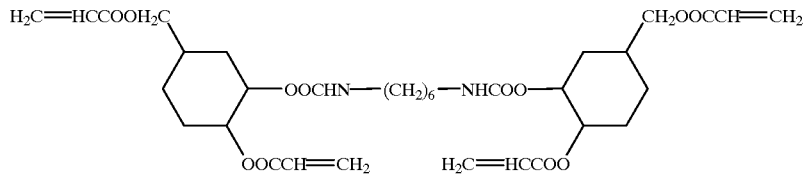
M-7
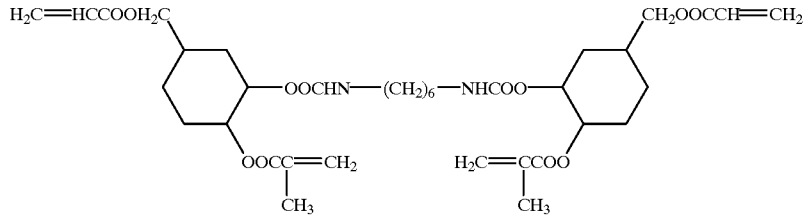
M-8
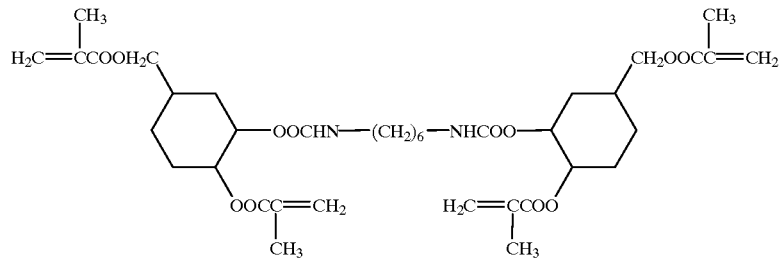
M-9 M-10
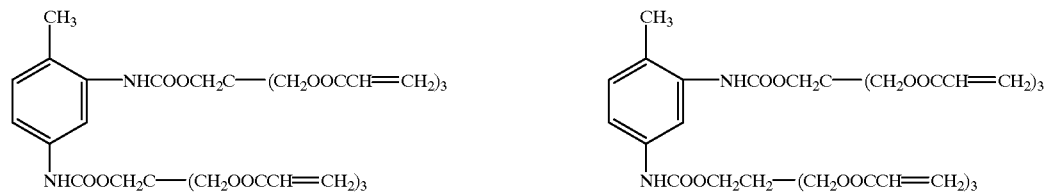

-continued
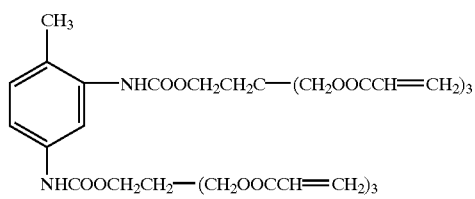
M-11
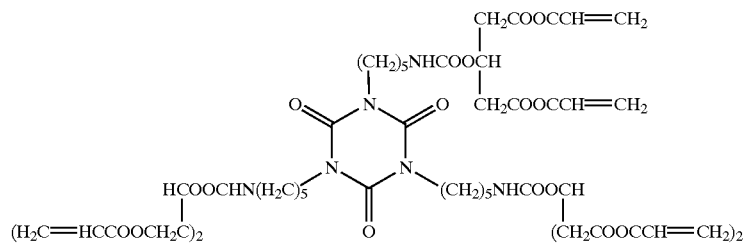
M-12
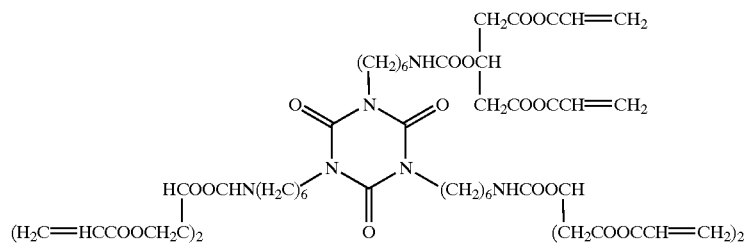
M-13
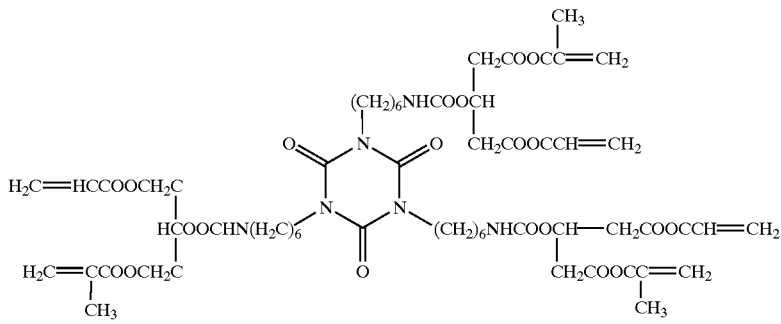
M-14
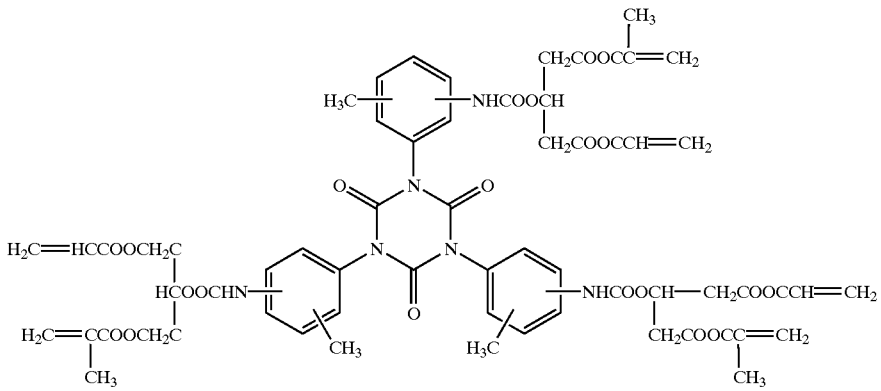
M-15

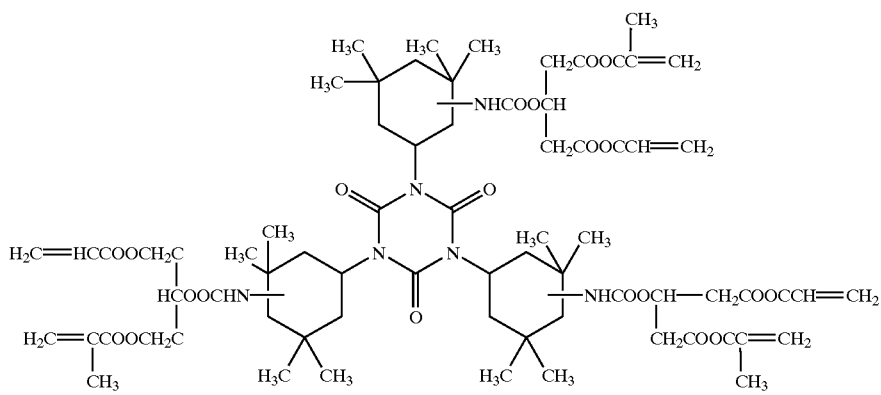

M-16

The (meth)acryloyloxyalkyl group-containing amine compound is an amine compound having a (meth) acryloyloxyalkyl partial structure. Particularly preferred is one having an alkylamine structure as the basic structure and further having a (meth)acryloyloxyalkyl partial structure. Specific examples of such a compound include those disclosed in e.g. JP-A-49-36614, JP-A-50-129214, JP-A-61-151197, JP-A-6-65218, JP-A-6-351889, Japanese Patent No. 2700168, and German Patent No. 3710281. More specifically, those represented by the following formula (I) may be mentioned.

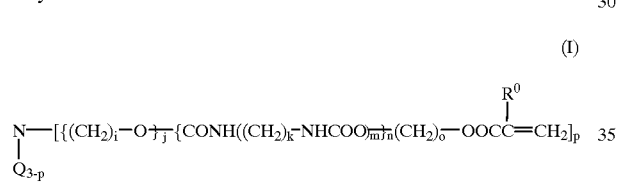

(I)

wherein $R^0$ is a hydrogen atom or a methyl group, each Q which is independent of each other, is a hydrogen atom, an alkyl group which may have a substituent or a carbamoyl group which may have a substituent, said alkyl groups may be connected to each other directly or via a nitrogen atom, i is an integer of from 1 to 12, j is an integer of from 0 to 5, k is an integer of from 2 to 12, m is 0 or 1, n is 0 or 1, o is an integer of from 1 to 5, and p is an integer of from 1 to 3, provided that when p=1, at least one of the remaining two Q is an alkyl group having a (meth)acryloyloxyalkyl group or a carbamoyl group having a (meth)acryloyloxyalkyl group, and when p=2, the remaining one Q is a hydrogen atom, an alkyl group which may have a substituent, or a carbamoyl group which may have a substituent.

In the formula (I), when Q is an alkyl group which may have a substituent, the carbon number is usually from 1 to 15, preferably from 1 to 5. Specific examples of such an alkyl group include a methyl group, an ethyl group, a hydroxyethyl group, an acetoxyethyl group, an N-(meth)acryloyloxyethyl-carbamoyl-oxymethyl group, an N-(meth)acryloyloxyethyl-carbamoyl-oxyethyl group, and an N-(meth)acryloyloxyethyl-carbamoyl-oxypropyl group.

Further, when the alkyl groups are connected to each other directly or via a nitrogen atom, the resulting ring is preferably a piperidyl ring or a piperazyl ring. Further, when Q is a carbamoyl group having a substituent, N-(meth)acryloyloxyethylcarbamoyl group may, for example, be mentioned as a specific example.

Further, i is preferably from 1 to 3, j is preferably 0 or 1, o is preferably from 1 to 3, and k is preferably from 2 to 6.

Compounds of the following formulae A-1 to A-14 may, for example, be mentioned as specific examples of the compound of the formula (I).

A-1
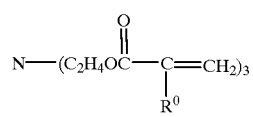

A-2
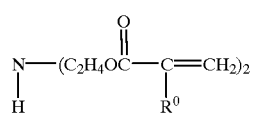

A-3
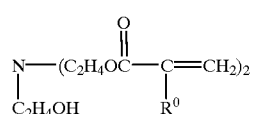

A-4
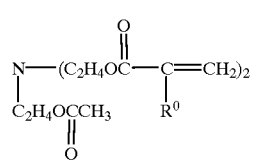

A-5
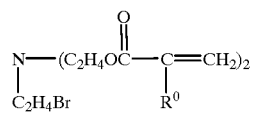

A-6
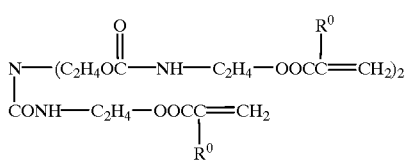

A-7
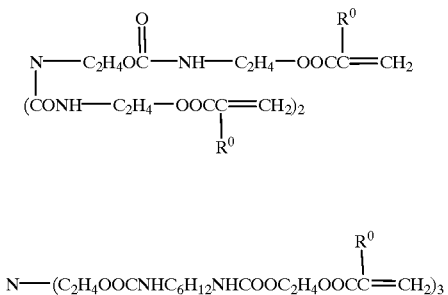

A-8
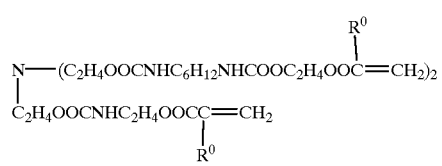

A-9
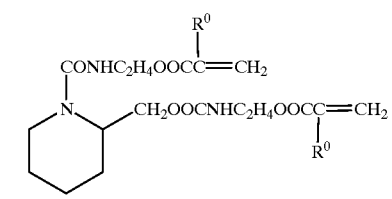

A-10
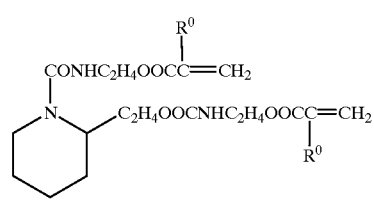

A-11
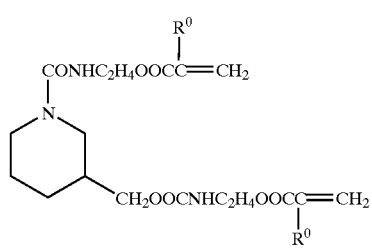

A-12

A-13
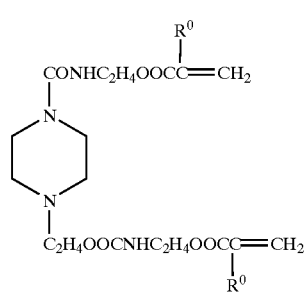

A-14
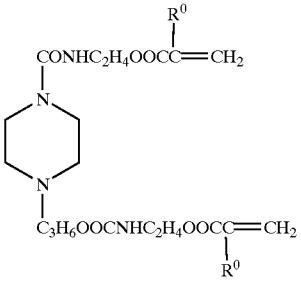

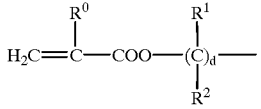

The (meth)acryloyloxyalkyl group-containing phosphate compound is a compound having a (meth)acryloyloxyalkyl group of the following formula (III) and a phosphate group of the following formula (IV) as partial structures.

$$H_2C=\overset{R^0}{\underset{}{C}}-COO-\overset{R^1}{\underset{R^2}{(C)_d}}-\tag{III}$$

wherein $R^0$ is a hydrogen atom or a methyl group, each of $R^1$ and $R^2$ which are independent of each other, is a hydrogen atom or an alkyl group, and d is an integer of from 1 to 25.

$$-\underset{(OH)_{3-e}}{\overset{}{P}}=O\tag{IV}$$

wherein e is 1 or 2.

The (meth)acryloyloxyalkyl group and the phosphate group are connected usually by a connecting chain X as shown below.

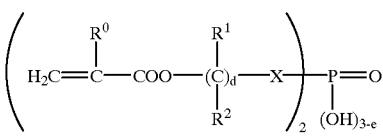

wherein X is a bivalent connecting chain, and $R^0$, $R^1$, $R^2$, d and e are as defined in the above formula (III) or (IV).

Specific examples of X include, for example, an alkylene chain, an ester bond, an ether bond, an amide bond, a urea bond and a urethane bond.

A particularly preferred (meth)acryloyloxyalkyl group-containing phosphate compound is a compound wherein a (meth)acryloyloxyalkyl group and a phosphate group are directly bonded as shown by the following formula (VI), without having a connecting chain X.

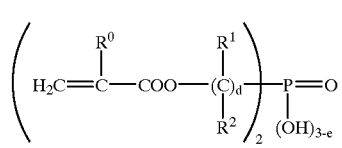

wherein $R^0$, $R^1$, $R^2$, d and e are as defined in the above formula (V).

In this case, each of $R^1$ and $R^2$ is preferably a hydrogen atom, and d is preferably within a range of from 1 to 10. Specific examples of such a compound include (meth) acryloyloxyethyl phosphate, bis[(meth)acryloyloxyethyl] phosphate and (meth)acryloyloxyethylene glycol phosphate.

(b) A Phthalocyanine Compound

The phthalocyanine compound showing the maximum absorption within a range of from 750 to 1,200 nm is a compound having a phthalocyanine basic structure of the following formula (V) or (VI), whereby the maximum absorption is controlled within the above range by selecting substituents on the aromatic rings or the type of the central metal.

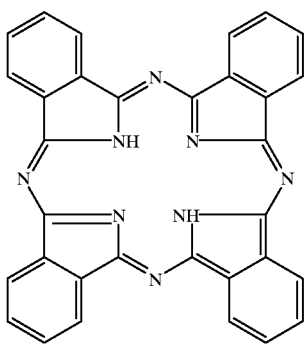

(V)

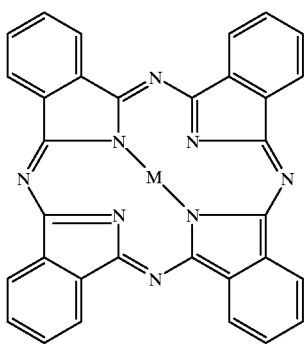

(VI)

wherein central metal M is a metal ion capable of forming a phthalocyanine complex salt, and the aromatic rings may have substituents, and such substituents may be connected to each other to form a condensed ring, and such a condensed ring may further have a substituent. As the above central metal M, various metals may be mentioned including alkali metals (Ia), alkaline earth metals (IIa) and metals of Group IIIb, Group IVb, Group Vb, Group VIb, Group VIIb, Group VIIIb, Group Ib, Group IIb, Group IIIa, Group IVa, Group Va, lanthanides and actinides.

The substituents on the aromatic rings and condensed rings may, for example, be an alkyl group, an alkoxy group, an alkoxyalkyl group, an aryl group, a halogen atom, a nitro group, a cyano group, an amino group, an alkoxycarbonyl group, a vinyl group, a carboxyl group, an acryloyl group and a thioether group.

Such a compound may be selected for use, for example, from phthalocyanine compounds disclosed in JP-A-64-60660, JP-A-1-100171, JP-A-3-31247, JP-A-4-15463, JP-A-4-15264, JP-A-4-15265 and JP-A-4-15266, alkylphthalocyanine compounds disclosed in JP-A-2-138382, acyloxyphthalocyanine compounds disclosed in JP-A-3-77840 and JP-A-3-100066, alkoxyphthalocyanine compounds disclosed in JP-A-4-348168, naphthalocyanine compounds disclosed in JP-A-60-23451, JP-A-61-215662, JP-A-61-215663, JP-A-63-270765, JP-A-1-287175, JP-A-2-43269, JP-A-2-296885, JP-A-3-43461, JP-A-3-265664 and JP-A-3-265665, and dinaphthalocyanine compounds disclosed in JP-A-1-108264 and JP-A-1-108265.

Among the above, preferred is a compound of the formula (VI) wherein M is a Group IIb metal such as Zn, a Group IVb metal such as Sn, a Group IIIb metal such as Al or Ga, a Group Ib metal such as Cu or a Group Va such as V, preferably a bivalent or tetravalent metal ion, particularly preferably Zn or Sn. Further, from the viewpoint of the solubility of the phthalocyanine compound, it is preferred that at least one aromatic ring has a substituent, wherein the substituent is selected from the group consisting of a $C_{1-6}$ alkyl group, a $C_{1-6}$ alkoxy group, a halogen atom and a $C_{2-8}$ alkoxyalkyl group, or substituents are connected to each other to form a naphthalocyanine structure, which has at least one substituent selected from the group consisting of a $C_{1-6}$ alkyl group, a $C_{1-6}$ alkoxy group, a $C_{2-8}$ alkoxyalkyl group and a halogen atom, provided that a plurality of substituents may be the same or different.

Specifically, the following compounds may, for example, be mentioned, wherein the specific chemical structures are shown together with the maximum absorption and the molar extinction coefficient at the maximum absorption. In the following, Me represents a methyl group, Et an ethyl group, Bu a butyl group, and Ph a phenyl group.

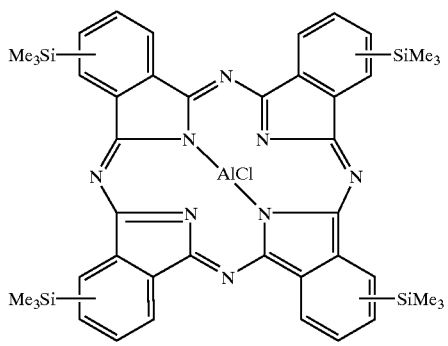

R-1
$\lambda max = 781$ nm $\varepsilon = 130000$

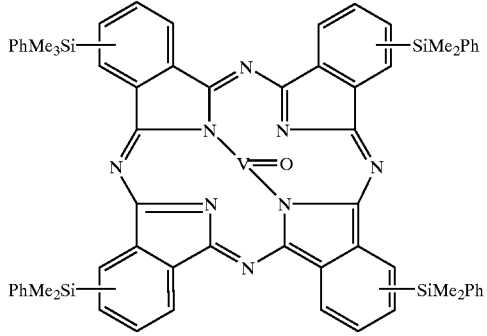

R-2
$\lambda max = 808$ nm $\varepsilon = 260000$

-continued
R-3
λmax = 808 nm ε = 230000
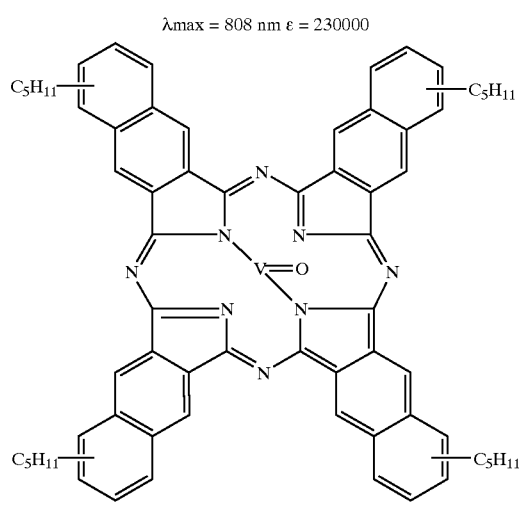
R-4
λmax = 810 nm ε = 190000
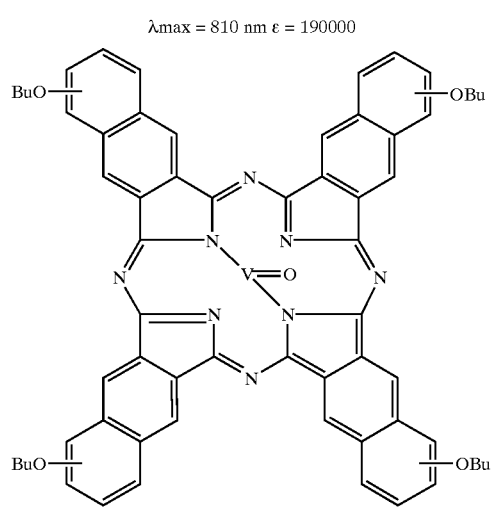
R-5
λmax = 810 nm ε = 190000
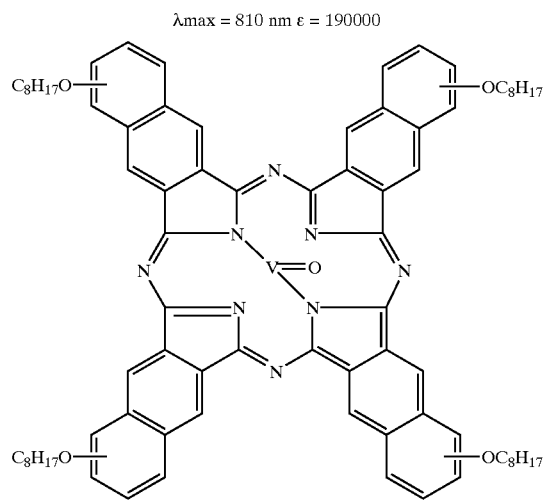
R-6
λmax = 810 nm ε = 270000
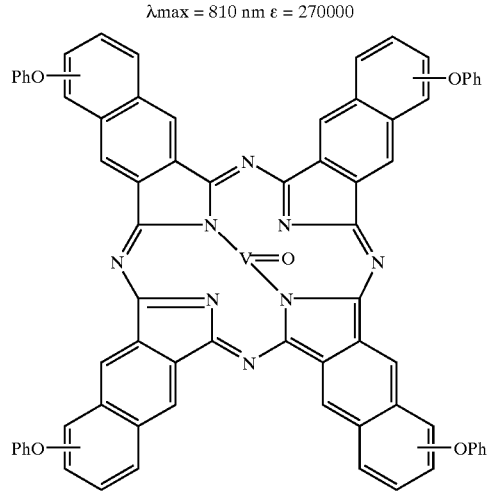
R-7
λmax = 811 nm ε = 180000
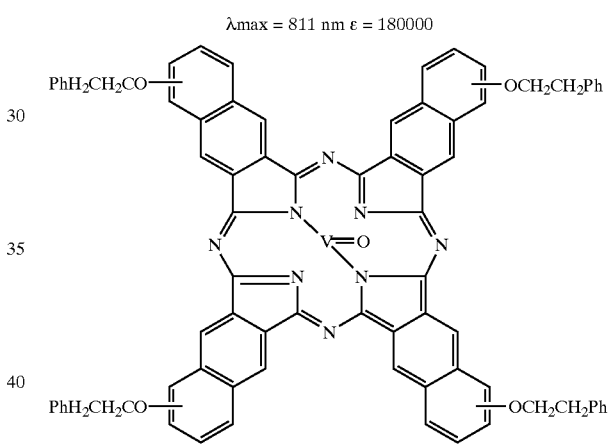
R-8
λmax = 812 nm ε = 280000
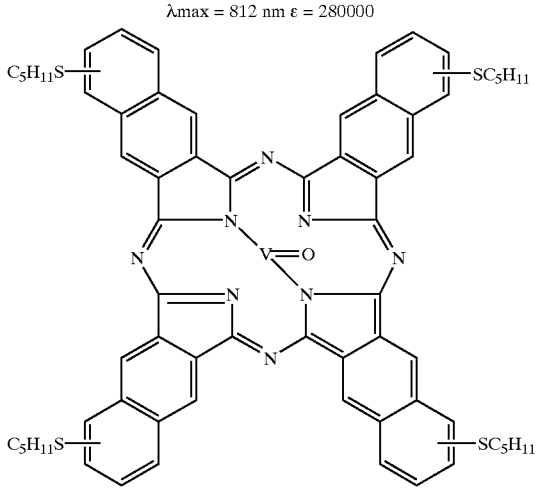

-continued
R-9
λmax = 824 nm ε = 310000
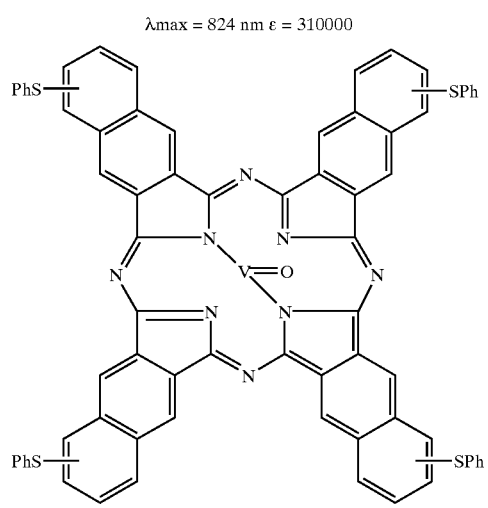
R-10
λmax = 831 nm ε = 200000
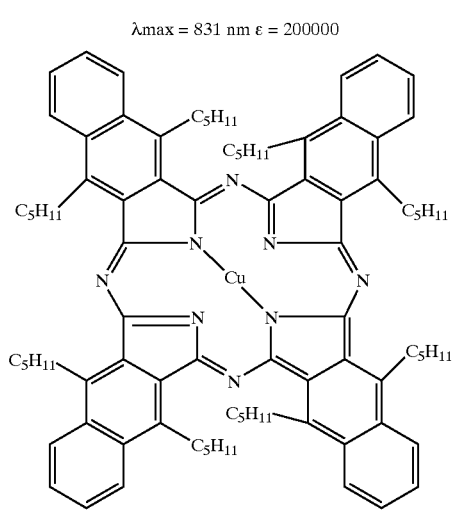
R-11
λmax = 850 nm ε = 200000
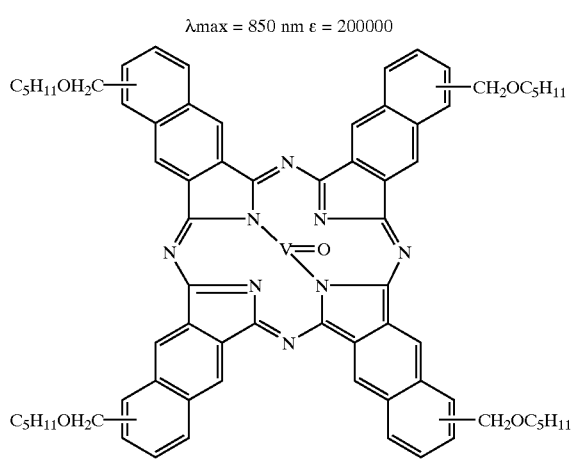
-continued
R-12
($\lambda_{max}$ = 810 nm ε ≥ 200000)
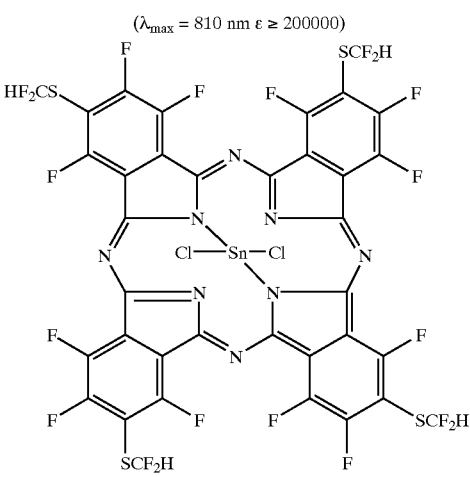
R-13
($\lambda_{max}$ = 800–900 nm ε ≥ 30000)
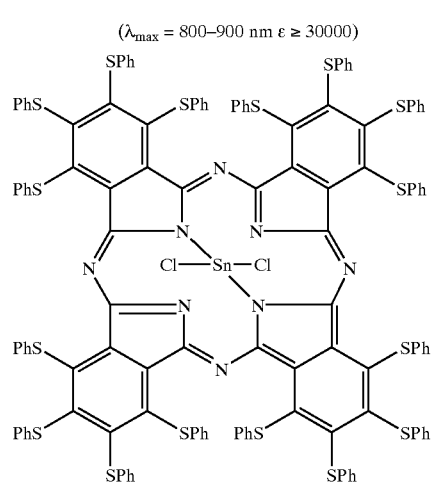
R-14
($\lambda_{max}$ = 810 nm ε ≥ 30000)
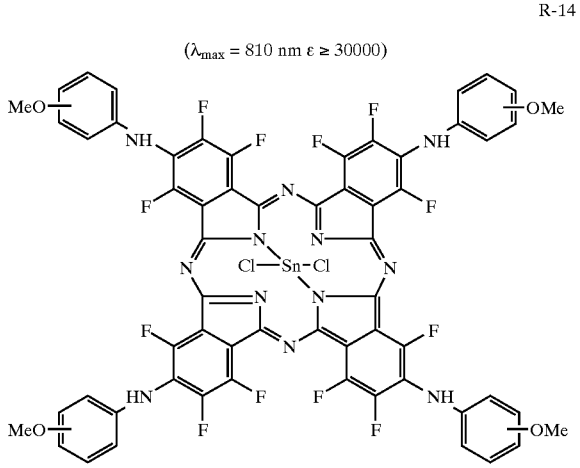

-continued
R-15
($\lambda_{max}$ = 830 nm $\varepsilon \geq$ 30000)
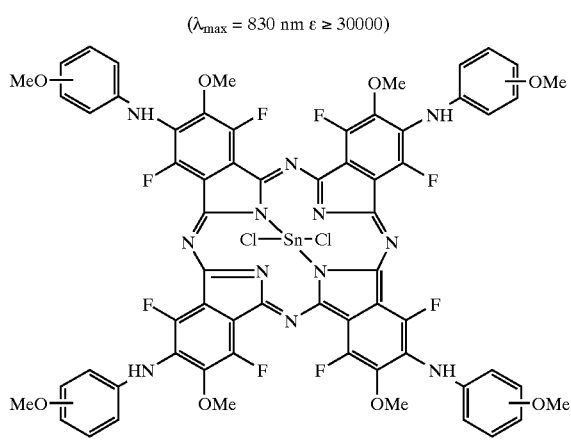
R-16
($\lambda_{max}$ = 830 nm $\varepsilon \geq$ 30000)
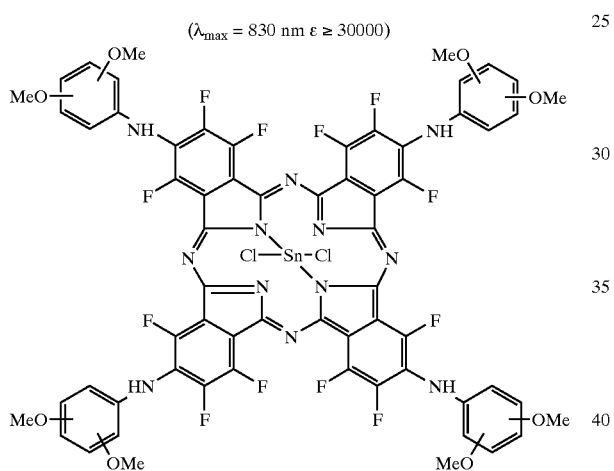
R-17
($\lambda_{max}$ = 800–900 nm $\varepsilon \geq$ 30000)
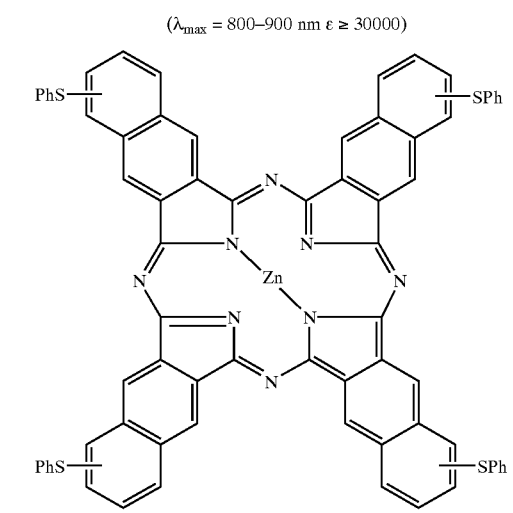
-continued
R-18
($\lambda_{max}$ = 800–900 nm $\varepsilon \geq$ 30000)
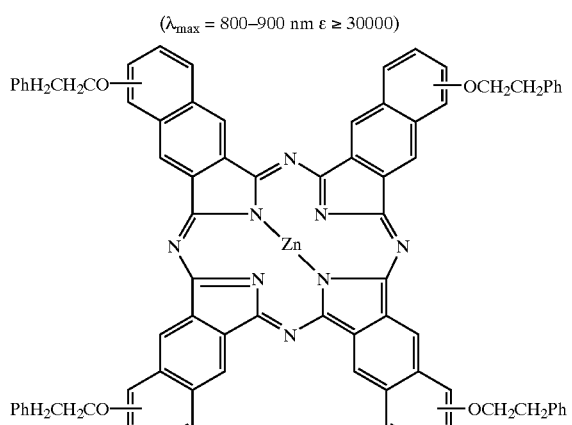
R-19
($\lambda_{max}$ = 800 - 900 nm $\varepsilon \geq$ 30000)
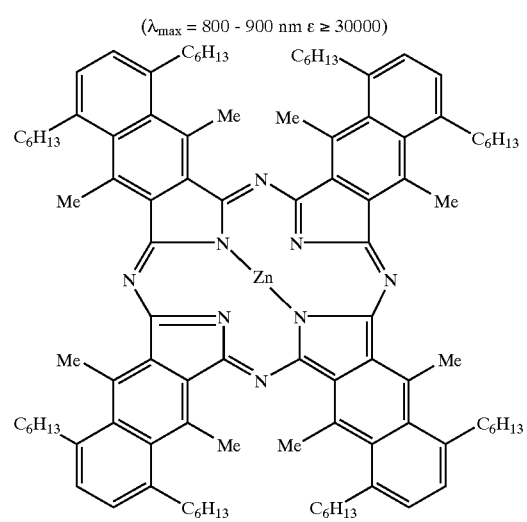
R-20
($\lambda_{max}$ = 800–900 nm $\varepsilon \geq$ 30000)
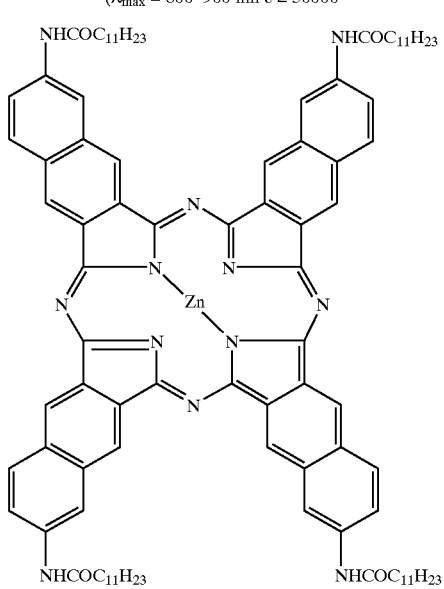

-continued

R-21

($\lambda_{max}$ = 800–900 nm $\epsilon \geq$ 30000)

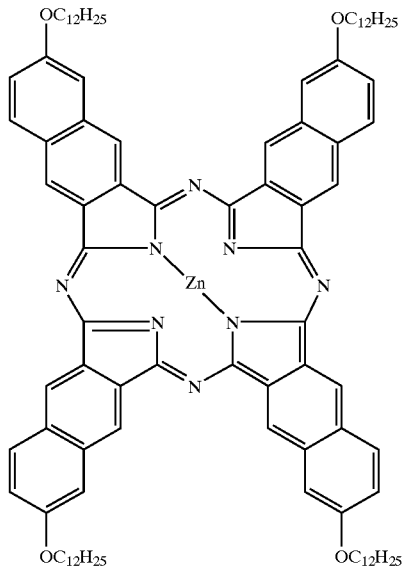

The maximum absorption is one measured by a spectrophotometry by dissolving the above compounds in organic solvents which are used as solvents for coating. Such organic solvents include, for example, halogenated hydrocarbons such as dichloromethane, chloroform, carbon tetrachloride and tetrachloroethylene, ethers such as tetrahydrofuran and diethyl ether, ketones such as acetone, methyl ethyl ketone and cyclohexanone, alcohols such as methanol, ethanol and propanol, glycol ethers such as methylcellosolve, ethylcellosolve, propylene glycol monomethyl ether and propylene glycol monoethyl ether, and hydrocarbons such as toluene and xylene.

Among the above-mentioned phthalocyanine compounds, preferred are those having the maximum absorption within a range of ±50 nm to the wavelength of the irradiated laser.

Further, the molar extinction coefficient $\epsilon$ is at least 10,000, preferably at least 20,000, more preferably at least 30,000. If the maximum absorption or the molar extinction coefficient departs from the above range, no adequate sensitivity tends to be obtainable.

(c) A Photopolymerization Initiator

The photopolymerization initiator to be used in the present invention may be any compound which is capable of forming active radicals to polymerize the unsaturated compound under irradiation with active light rays. Various compounds may be employed including, for example, an organic boron complex which will be described in detail hereinafter, a halomethylated triazine compound such as 2-(4-methoxyphenyl)-4,6-bis(trichloromethyl)-s-triazine, 2-(4-methoxynaphthyl)-4,6-bis(trichloromethyl)-s-triazine, 2-(4-ethoxynaphthyl)-4,6-bis(trichloromethyl)-s-triazine or 2-(4-ethoxycarbonylnaphthyl)-4,6-bis(trichloromethyl)-s-triazine, a halomethylated oxadiazole compound such as 2-20 trichloromethyl-5-(2'-benzofuryl)-1,3,4-oxadiazole, 2-trichloromethyl-5-(-(2'-oxadiazole, 2-trichloromethyl-5-[β-(2'-(6"-bezofuryl)vinyl)]-1,3,4-oxadiazole or 2-trichloromethyl-5-furyl-1,3,4-oxadiazole, an imidazole compound such as 2-(2'-chlorophenyl)-4,5-diphenylimidazole dimer, 2-(2'-chlorophenyl)-4,5-bis (3'-methoxyphenyl) imidazole dimer, 2-(2'-fluorophenyl)-4,5-diphenylimidazole dimer, 2-(2'-methoxyphenyl)-4,5-diphenylimidazole dimer or (4'-methoxyphenyl)-4,5-diphenylimidazole dimer, a benzoin alkyl ether such as benzoin methyl ether, benzoin phenyl ether, benzoin isobutyl ether or benzoin isopropyl ether, an anthraquinone compound such as 2-methylanthraquinone, 2-ethylanthraquinone, 2-t-butylanthraquinone or 1-chloroanthraquinone, a benzanthrone compound, a benzophenone compound such as benzophenone, Michler's ketone, 2-methylbenzophenone, 3-methylbenzophenone, 4-methylbenzophenone, 2-chlorobenzophenone, 4-bromobenzophenone or 2-carboxybenzophenon, an acetophenone compound such as 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-p-dodecylphenyl) ketone, 2-methyl-(4'-(methylthio)phenyl)-2-morpholino-1-propanone or 1,1,1-trichloromethyl-(p-butylphenyl)ketone, a thioxanthone compound such as thioxanthone, 2-ethylthioxanthone, 2-isopropylthioxanthone, 2-chlorothioxanthone, 2,4-dimethylthioxanthone, 2,4-diethylthioxanthone or 2,4-diisopropylthioxanthone, an benzoate such as ethyl p-dimethylaminobenzoate or ethyl p-diethylaminobenzoate, an acridine compound such as 9-phenylacridine or 9-(p-methoxyphenyl)acridine, a phenazine compound such as 9,10-dimethylbenzphenazine, and a titanocene compound such as di-cyclopentadienyl-Ti-dichloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-2,6-di-fluorophen-1-yl, di-cyclopentadienyl-Ti-2,4-di-fluorophen-1-yl, di-methylcyclopentadienyl-Ti-bis-2,3,4,5,6-pentafluorophen-1-yl, di-methylcyclopentadienyl-Ti-bis-2,6-di-cyclopentadienyl-Ti-2,6-di-fluoro-3-(pyl-1-yl)-phen-1-yl. However, from the viewpoint of the sensitivity, an organic boron complex or a halomethyl group-containing compound is preferred, and particularly preferred is an organic boron complex or a halomethyltriazine compound. From the viewpoint of the sensitivity and the stability, particularly from the viewpoint of the handling property under white light, the most preferred photopolymerization initiator is the organic boron complex which will be described below.

The organic boron complex to be used in the present invention is a compound having a basic structure represented by the following formula (VII).

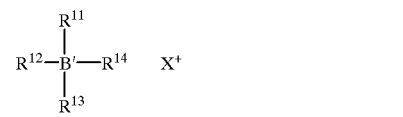

(VII)

wherein each of $R^{11}$ to $R^{14}$ which are independent of one another, is an alkyl group which may have a substituent, an aryl group which may have a substituent, an aralkyl group which may have a substituent, an alkylaryl group which may have a substituent, an alkenyl group which may have a substituent, an alkynyl group which may have a substituent, an alicyclic group which may have a substituent or a heterocyclic group which may have a substituent, provided that they may be connected to each other to form a cyclic structure, and $X^+$ is a counter cation.

From the viewpoint of the stability and high polymerization activities, a triarylalkylboron complex is preferred wherein among $R^{11}$ to $R^{14}$, three are aryl groups which may have a substituent, and one is an alkyl group which may have a substituent.

With respect to $R^{11}$, $R^{12}$, $R^{13}$ and $R^{14}$, the alkyl group and the alicyclic group are preferably those having from 1 to 10 carbon atoms, the alkenyl group and the alkynyl group are preferably those having from 1 to 15 carbon atoms, and the aryl group and the alkylaryl group are preferably those having from 6 to 20 carbon atoms. As the aryl group, a phenyl group is particularly preferred. Their substituents may, for example, be an alkyl group, an alkoxy group, a carboxyl group, an acyloxy group, an alkoxycarbonyl group, a hydroxyl group, an amino group, an alkylamino group, a halogenated alkyl group or a halogen atom, and particularly preferred is a halogen atom.

The aryl group is preferably a phenyl group, and the alkyl group is preferably a $C_{1-10}$ alkyl group.

Further, also preferred is an organic boron complex wherein aryl groups bonded to boron, are chemically bonded to each other as shown below.

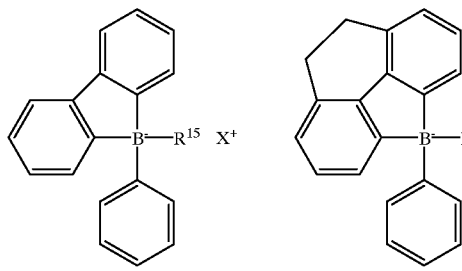

wherein $R^{15}$ is an alkyl group.

Specific examples of preferred anions in such organic boron complexes include a n-butyl-triphenylboron anion, a n-butyl-tris(p-methylphenyl)boron anion, a n-butyl-tris(2,4,6-trimethylphenyl)boron anion, a n-butyl-tris(p-methoxyphenyl)boron anion, a n-butyl-tris(m-chlorophenyl)boron anion, a n-butyl-tris(p-chlorophenyl)boron anion, a n-butyl-tris(m-fluorophenyl)boron anion, a n-butyl-tris(p-fluorophenyl)boron anion, a n-butyl-tris(2,6-difluorophenyl)boron anion, a n-butyl-tris(2,4,6-trifluorophenyl)boron anion, a n-butyl-tris(2,3,4,5,6-pentafluorophenyl)boron anion, a n-butyl-tris(m-trifluoromethylphenyl)boron anion, a n-butyl-tris(3,5-di-trifluoromethylphenyl)boron anion, a n-but difluoro-3-pyrrolylphenyl)boron anion and a n-hexyl-tris(m-fluorophenyl)boron anion.

As the counter cation, one showing absorption in a visible light region such as a cation dye disclosed in JP-A-62-143044 or JP-A-62-150242, is poor in stability, and accordingly, preferred is one showing little absorption in the visible light region. The counter cation may, for example, be an onium cation such as ammonium, phosphonium, arsonium, stibonium, oxonium, sulfonium, selenonium, stannonium or iodonium, or a transition metal-coordinated cation complex. Among them, an ammonium cation is preferred, and particularly preferred is a tetraalkyl ($C_{1-10}$) ammonium cation.

The following compounds may, for example, be mentioned to show specific chemical structures.

In the following, Me represents a methyl group, Et an ethyl group, and Bu a butyl group.

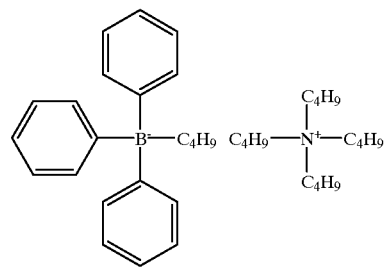

B-1

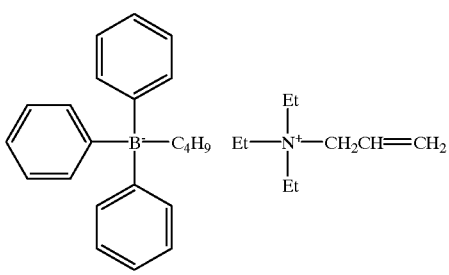

B-2

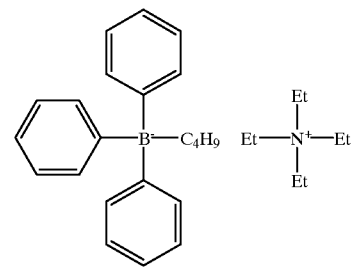

B-3

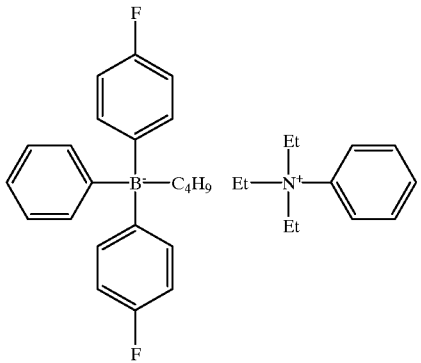

B-4

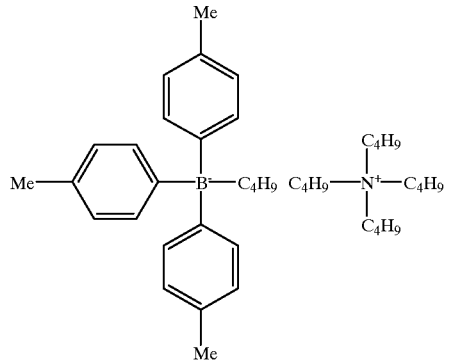

B-5

B-6
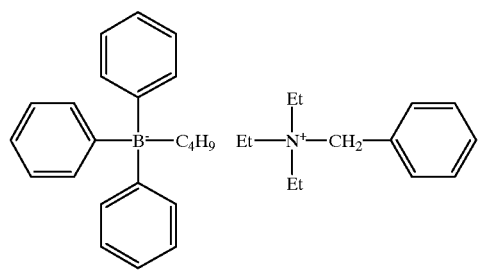
B-11
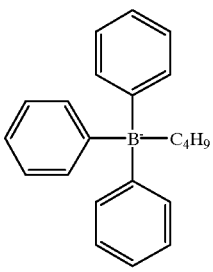
B-7
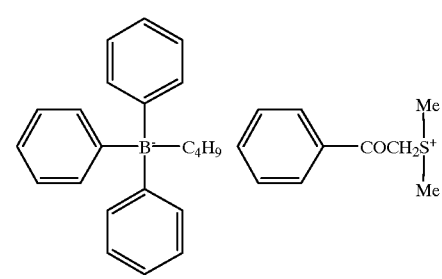
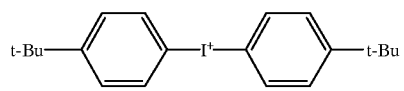
B-8
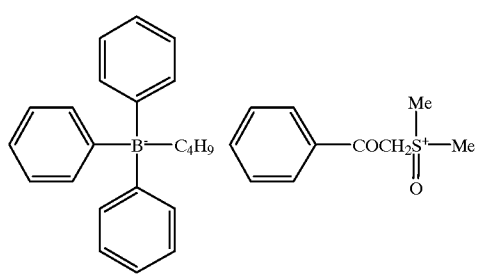
B-12
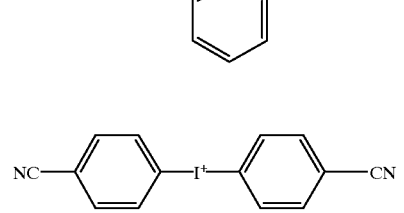
B-9
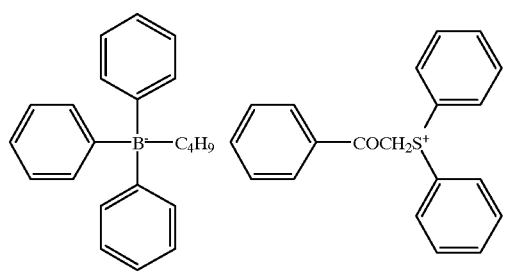
B-13
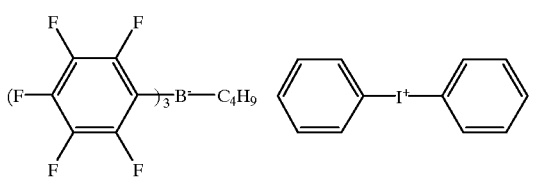
B-10
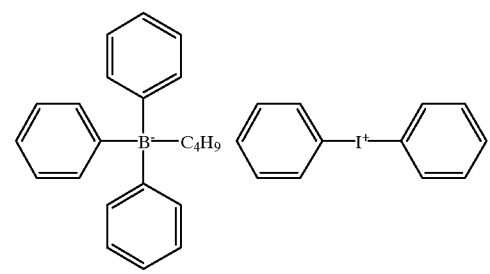
B-14
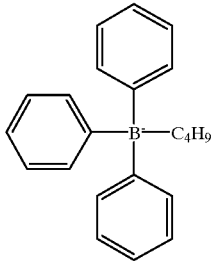
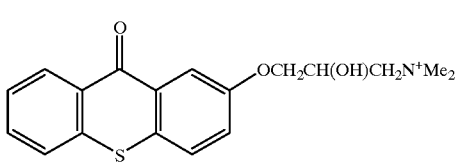

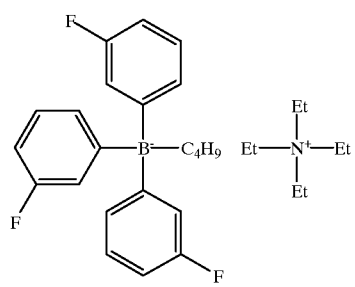 B-15
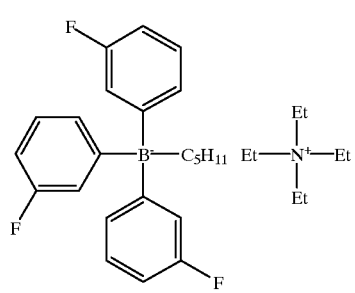 B-16
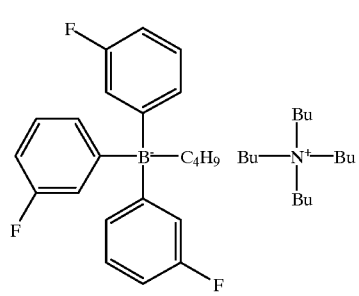 B-17
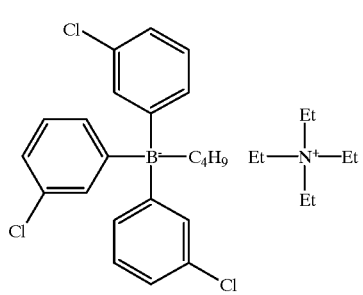 B-18
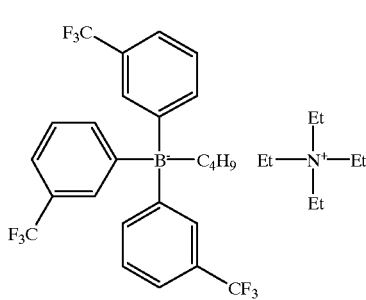 B-19
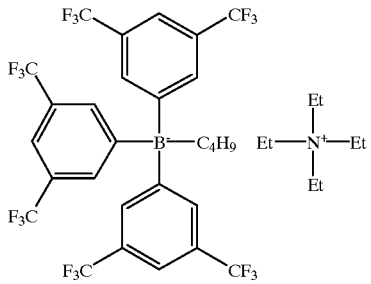 B-20
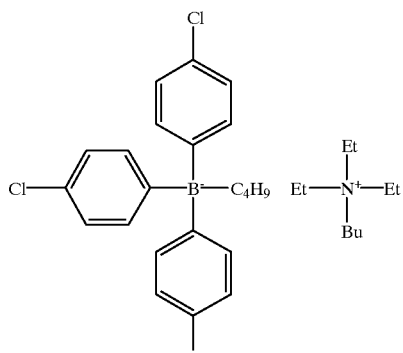 B-21
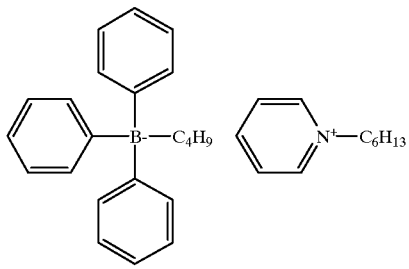 B-22
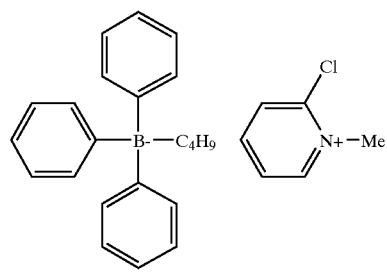 B-23
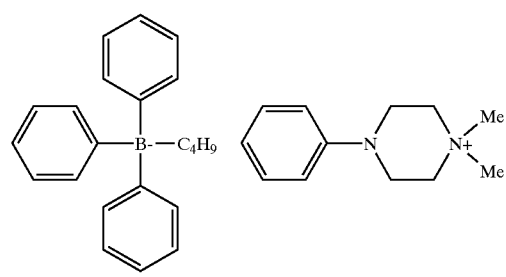 B-24

-continued

B-25

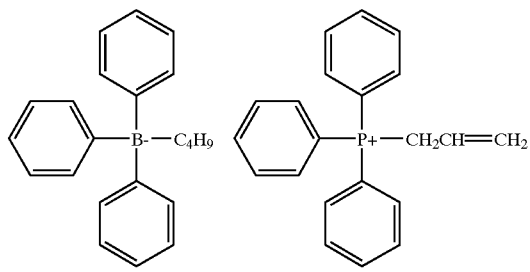

Preferred blend proportions of the above-mentioned essential components are such that, relative to 100 parts by weight of (a) the ethylenically unsaturated compound, the phthalocyanine as (b) the sensitizing dye, is from 0.01 to 30 parts by weight, preferably from 0.05 to 25 parts by weight, more preferably from 5 to 25 parts by weight, and (c) the photopolymerization initiator is from 0.01 to 30 parts by weight, preferably from 0.05 to 25 parts by weight, more preferably from 5 to 25 parts by weight.

If the blend proportions are outside the above ranges, problems such as crystallization of the sensitizing agent or the initiator, decrease in the sensitivity and deterioration of the coating properties, are likely to result. Further, relative to one part by weight of the sensitizing dye, the photopolymerization initiator is preferably from 0.05 to 50 parts by weight, more preferably from 0.1 to 40 parts by weight, most preferably from 0.1 to 10 parts by weight.

The composition of the present invention may further contain a resin to improve the film-forming performance, in addition to the above components. For this purpose, an alkali-soluble resin is preferred, since the developability, the heat resistance, the chemical resistance, etc., can be improved by its addition. As such a resin, a resin having carboxyl groups or phenolic hydroxyl groups may be mentioned.

The resin having carboxyl groups may, for example, be 1) a resin obtained by radical polymerization or ion polymerization of a monomer having a carboxyl group 2) a resin obtained by hydrolyzing or half-esterifying acid anhydride units by radical or ion polymerization of a monomer having an acid anhydride, or 3) an epoxy acrylate obtained by modifying an epoxy resin with an unsaturated monocarboxylic acid or acid anhydride.

The resin having phenolic hydroxyl groups, may, for example, be 4) a resol resin or a novolak resin obtained by addition condensation of a phenol compound, or 5) a resin obtained by polymerizing a vinylphenol.

As a specific example, a vinyl resin having carboxyl groups, may, for example, be a resin obtained by homopolymerization of an unsaturated carboxylic acid monomer such as (meth)acrylic acid, 2-succinoyloxyethyl methacrylate, 2-maleinoyloxyethyl methacrylate, 2-phthaloyloxyethyl methacrylate, 2-hexahydrophthaloyloxyethyl methacrylate, maleic acid, fumaric acid, itaconic acid or crotonic acid, as a monomer having a carboxyl group, or a resin obtained by copolymerization of such an unsaturated carboxylic acid monomer with a vinyl monomer containing no carboxyl group, such as styrene, α-methylstyrene, methyl (meth)acrylate, ethyl (meth)acrylate, propyl (meth)acrylate, isopropyl (meth) acrylate, butyl (meth)acrylate, vinyl acetate, acrylonitrile, (meth)acrylamide, glycidyl (meth)acrylate, allylglycidyl ether, glycidyl ethylacrylate, crotonic acid glycidyl ether, (meth)acrylic acid chloride, benzyl (meth)acrylate, hydroxyethyl (meth)acrylate, N-methylol acrylamide, N,N-dimethylacrylamide, N-methacryloylmorpholine, N,N-dimethylaminoethyl (meth)acrylate or N,N-dimethylaminoethylacrylamide.

Further, a resin obtained by copolymerizing maleic anhydride with e.g. α-methylstyrene, followed by half esterification of maleic anhydride unit moieties with a monohydric alcohol such as methanol, ethanol, propanol, butanol or hydroxyethyl (meth)acrylate or by hydrolysis of maleic anhydride unit moieties with water, may also be preferably employed.

Further, a resin obtained by adding an unsaturated carboxylic acid compound such as (meth)acrylic acid, 2-succinoyloxyethyl methacrylate, 2-maleinoyloxyethyl methacrylate, 2-phthaloyloxyethyl methacrylate, 2-hexahydrophthaloyloxyethyl methacrylate, maleic acid, fumaric acid, itaconic acid or crotonic acid, or a saturated carboxylic acid such as acetic acid, propionic acid or stearic acid, to e.g. a novolak epoxy acrylate resin or a bisphenol epoxy resin, followed by modification with an acid anhydride such as maleic anhydride, itaconic anhydride, tetrahydrophthalic anhydride or phthalic anhydride, may also be preferred. The resin having phenolic hydroxyl groups, may be a resin obtained by addition condensation of a phenol such as phenol, (o, m or p)-cresol, (o, m or p)-ethylphenolxylenol, (o, m or p)-propylphenol, (o, m or p)-butylphenol, resorcinol, pyrogallol or hydroxybenzophenone with e.g. formaldehyde, paraformaldehyde, acetaldehyde or acetone in the presence of an acidic or basic catalyst.

Further, a resin obtained by homopolymerization of (o, m or p)-vinylphenol, a resin obtained by copolymerizing it with styrene, α-methylstyrene, methyl (meth)acrylate, ethyl (meth)acrylate, propyl (meth)acrylate, isopropyl (meth) acrylate, butyl (meth)acrylate, vinyl acetate, acrylonitrile, (meth)acrylamide, glycidyl (meth)acrylate, allylglycidyl ether, glycidyl ethylacrylate, crotonic acid glycidyl ether, (meth)acrylic acid chloride, benzyl (meth)acrylate, hydroxyethyl (meth)acrylate, N-methylolacrylamide, N,N-dimethylacrylamide, N-methacryloylmorpholine, N,N-dimethylaminoethyl (meth)acrylate or N,N-dimethylaminoethylacrylamide, or a resin having some of phenolic hydroxyl groups protected by e.g. t-BOC, a vinyl ether or a silyl group, may also be preferred.

From the viewpoint of the developability, a resin having carboxyl groups, is preferred, and particularly preferred is a (meth)acryl (co)polymer resin comprising (meth)acrylic acid.

Specifically, the copolymer may, for example, be a methyl methacrylate/methacrylic acid copolymer as disclosed in JP-A-60-208748, a methyl methacrylate/methyl acrylate/acrylic acid copolymer as disclosed in JP-A-60-214354, a benzyl methacrylate/methyl methacrylate/methacrylic acid/2-ethylhexyl acrylate copolymer as disclosed in JP-A-5-36581, a methyl methacrylate/n-butyl methacrylate/2-ethylhexyl acrylate/methacrylic acid copolymer as disclosed in JP-A-5-333542, a styrene/methyl methacrylate/methyl acrylate/methacrylic acid copolymer as disclosed in JP-A-7-261407, a methyl methacrylate/n-butyl acrylate/2-ethylhexyl acrylate/methacrylic acid copolymer as disclosed in JP-A-10-110008, or a methyl methacrylate/n-butyl acrylate/2-ethylhexyl acrylate/styrene/methacrylic acid copolymer as disclosed in JP-A-10-198031.

Also preferred as an alkali-soluble resin of the present invention is a resin having a double bond (an ethylenically unsaturated bond) in its side chain. Such a side chain double bond may be formed, for example, by adding an ethylenically unsaturated group-containing epoxy compound to the above-mentioned alkali-soluble resin having carboxyl groups, more specifically to carboxyl groups of a (meth) acryl copolymer.

As the epoxy unsaturated compound, one having a glycidyl group as an epoxy group, such as glycidyl (meth) acrylate or allylglycidyl ether may be used. However, preferred is an unsaturated compound having an alicyclic epoxy group. The following compounds may, for example, be mentioned as such a compound.

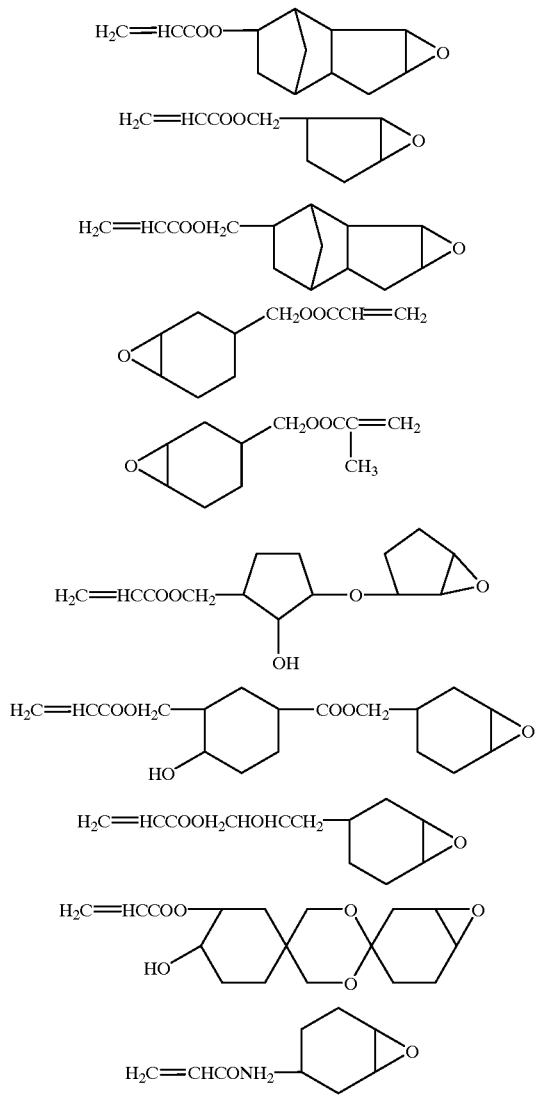

The introduction of the epoxy unsaturated compound into the side chain of the resin is carried out usually in an organic solvent at a reaction temperature of from 50 to 150° C. for from a few hours to a few tens hours in the presence of a catalyst e.g. a tertiary amine such as triethylamine or benzylmethylamine, a quaternary ammonium salt such as dodecyltrimethylammonium chloride, tetramethylammonium chloride or tetraethylammonium chloride, pyridine or triphenylphosphine. The amount of an alicyclic epoxy unsaturated compound to be introduced, is preferably controlled so that the acid value of the alkali-soluble resin, which will be described hereinafter, will be within a range of from 5 to 200 KOH.mg/g, whereby the alkali developability of the resin will be good.

The acid value of the above alkali-soluble resin is preferably within a range of from 5 to 250 KOH.mg/g from the viewpoint of the alkali developability. Further, with respect to the blend ratio, the alkali-soluble resin is preferably added in an amount of at most 5,000 parts by weight, preferably from 50 to 500 parts by weight, per 100 parts by weight of (a) the ethylenically unsaturated compound, from the viewpoint of the image-forming property. The molecular weight is preferably within a range of from 500 to 5,000,000, preferably from 1,000 to 500,000.

For various applications or purposes, the photosensitive composition of the present invention may contain, in addition the above-mentioned essential components, various additives including, for example, a coating property-improving agent such as an anionic, cationic, nonionic or fluorine type surfactant, a defoaming agent, an agent for imparting a visible image-forming property after exposure, a coloring agent, an adhesive-improving agent, a development-improving agent, an ultraviolet ray-absorbing agent and a polymerization stabilizer.

The composition of the present invention may be used in the form of a photosensitive liquid having the above components dissolved in a solvent or in the form of a dry film of a photosensitive lithographic printing plate formed by coating the photosensitive composition of the present invention on a support, followed by drying to form a layer of the composition on the support. In the case of a photosensitive liquid, the solvent is not particularly limited so long as it is capable of dissolving or dispersing the above-described components. For example, it may be diisopropyl ether, mineral spirit, n-pentane, amyl ether, ethyl caprylate, n-hexane, diethyl ether, isoprene, ethyl isobutyl ether, butyl stearate, n-octane, diisobutylene, amyl acetate, butyl butyrate, butyl ether, diisobutyl ketone, methylcyclohexene, methyl nonyl ketone, propyl ether, dodecane, Socal solvent No. 1 and No. 2, amyl formate, dihexyl ether, diisopropyl ketone, Solvesso #150, butyl acetate (n, sec or t), hexene, Shell Ts28 solvent, butyl chloride, ethyl amyl ketone, ethyl benzoate, amyl chloride, ethylene glycol diethyl ether, ethyl orthoformate, methoxymethylpentanone, methyl butyl ketone, methyl hexyl ketone, methyl isobutyrate, benzonitrile, ethyl propionate, methylcellosolve acetate, methyl isoamyl ketone, methyl isobutyl ketone, propyl acetate, amyl formate, bicyclohexyl, diethylene glycol monoethyl ether acetate, dipentenone, methoxymethylpentanol, methyl amyl ketone, methyl isopropyl ketone, propyl propionate, propylene glycol t-butyl ether, methyl ethyl ketone, methylcellosolve, ethylcellosolve, ethylcellosolve acetate, carbitol, cyclohexanone, ethyl acetate, propylene glycol, propylene glycol monomethyl ether, propylene glycol monomethyl ether acetate, propylene glycol monoethyl ether, propylene glycol monoethyl ether acetate, dipropylene glycol monoethyl ether, dipropylene glycol monomethyl ether, propylene glycol monoethyl ether acetate, dipropylene glycol monomethyl ether acetate, 3-methoxypropionic acid, 3-ethoxypropionic acid, ethyl 3-ethoxypropionate, methyl 3-methoxypropionate, ethyl 3-methoxypropionate, propyl 3-methoxypripionate, butyl 3-methoxypropionate, diglyme, dipropylene glycol monomethyl ether, ethylene glycol acetate, ethyl carbitol, butyl carbitol, ethylene glycol monobutyl ether, propylene glycol t-butyl ether, 3-methyl-3-methoxybutanol, tripropylene glycol methyl ether, or 3-methyl-3-methoxybutyl acetate. The amount of the solvent is usually within a range of from 1 to 20 times by weight, based on the total amount of the photosensitive composition.

Now, methods for using the photosensitive composition of the present invention will be described.

When it is used as a photosensitive liquid, it is coated on a substrate by e.g. a blade coater, a rod coater, a roll coater, a roll doctor coater, a transfer roll coater, a gravure coater, a kissroll coater, a curtain coater, a spin coater, a dip coater or a spray coater, followed by drying in an oven or on a hot plate. Further, a protective layer of e.g. polyethylene, polypropylene or poval, may be laminated on the photosensitive layer.

In the case of a dry film, the dry film obtained by coating and drying in a similar manner, may be laminated on a substrate by a laminator to form a photosensitive layer on the substrate.

The substrate is not particularly limited, and a substrate commonly used for e.g. printing plates, printed boards, plasma display devices or color filters, is suitable for use. For example, it may be an aluminum plate having electrolytic treatment applied thereto, a resin plate of e.g. epoxy, polyimide, paper phenol or glass epoxy having a copper foil laminated thereon, an engineering plastic of e.g. polycarbonate, polyphenylene sulfide or polyether ether ketone, a glass substrate of e.g. soda glass, quartz glass or lead glass, a substrate having ITO, chromium, gold or the like vapor-deposited, chemical vapor deposited or sputtered thereon, or a ceramic substrate. An image-forming material will be obtained by forming a layer of the photosensitive composition of the present invention on such a substrate. An image-forming material wherein the substrate is an aluminum support, is particularly useful as a photosensitive lithographic printing plate.

Now, an aluminum support having grain treatment and anodizing treatment applied, which is particularly suitable for the present invention, will be described. As the material for the aluminum support, pure aluminum or an aluminum alloy may be used. The aluminum support is usually preferably subjected to degreasing treatment to remove rolling oil from the aluminum surface prior to grain treatment. When an aqueous alkali solution of e.g. sodium hydroxide is employed for the degreasing treatment, smut will be formed on the support surface and in such a case, it is preferred to apply desmutting treatment by dipping the support in an acid such as phosphoric acid, nitric acid, sulfuric acid or chromic acid, or in a mixed acid thereof.

The grain treatment may be carried out by a so-called mechanical grain treatment wherein the surface is mechanically roughened, by a so-called electrochemical grain treatment wherein the surface is electrochemically roughened, or by a so-called chemical grain treatment wherein the surface is roughened by an alkali or acid, or by an etching agent made of a mixture thereof. Further, a method having such treatments suitable combined, may also be used.

The mechanical grain treatment includes, for example, ball polishing, brush polishing, blast polishing, buff polishing and horning polishing.

The electrochemical grain treatment may be carried out, for example, by a method wherein the support is electrically treated by alternate current or direct current in an electrolyte containing hydrochloric acid or nitric acid. The voltage to be applied in the electrochemical grain treatment is preferably from 1 to 50 V, more preferably from 5 to 30 V. the current density is preferably from 10 to 200 A/dm$^2$, more preferably from 20 to 150 A/dm$^2$. The quantity of electricity is usually from 100 to 2,000 C/dm$^2$, preferably from 200 to 1,500 C/dm$^2$, more preferably from 200 to 1,000 C/dm$^2$. The temperature is preferably from 10 to 50° C., more preferably from 15 to 45° C. The concentration of hydrochloric acid or nitric acid in the electrolyte is preferably from 0.1 to 5 wt %.

In the present invention, the above-described grain treatment is carried out preferably so that the surface roughness of the aluminum support will be from 0.1 to 1.2 μm by the centerline average surface roughness Ra as prescribed in JIS B0601-1982. When the surface roughness is within this range, the adhesion between the photosensitive layer and the support, uniformity in development, printing resistance, resolution and stability will be especially good.

The grain-treated aluminum support will then be subjected to anodizing treatment. The electrolyte to be used for the anodizing treatment may be any electrolyte so long as it is capable of forming a porous oxidized coating film, and usually, sulfuric acid, phosphoric acid, oxalic acid, chromic acid, sulfamic acid, benenesulfonic acid or a mixed acid in combination of two or more of them, is used. The conditions for the anodizing treatment are usually such that the concentration of the electrolyte is from 1 to 80 wt %, the temperature is from 5 to 70° C., the current density is from 1 to 60 A/dm$^2$, the voltage is from 1 to 100 V, and the electrolyzing time is within a range of from 10 seconds to 5 minutes. Preferably, the anodizing treatment is carried out by using sulfuric acid as the electrolyte, and the treatment is usually carried out by a direct current, but an alternate current may also be employed. In such a case, it is preferred to carry out electrolytic treatment for from 20 to 250 seconds at a current density of from 1 to 20 A/dm$^2$ at a temperature of from 20 to 50° C. at a concentration of sulfuric acid of from 10 to 50 wt %. After the anodizing treatment, the aluminum support may be subjected to pore sealing treatment.

In some cases, after the anodizing treatment, or after the pore sealing treatment (if applied) the aluminum support may further be subjected to hydrophilic treatment.

The coated amount of the photosensitive composition varies depending upon the particular use, but is usually within a range of from 0.5 to 100 μm as a dried thickness. For example, in the case of a lithographic printing plate, it is usually from 0.5 to 10 μm, preferably from 0.5 to 5 μm more preferably from 1 to 3 μm, and in the case where the composition is used for e.g. a dry film, it is preferably from 3 to 100 μm, more preferably from 5 to 70 μm.

By such drying, an image-forming material will be formed.

Further, as a protective layer, an oxygen-sealing layer of poval, polyvinylpyrrolidone, polyethylene or polypropylene may be formed thereon, whereby the sensitivity will be improved as the polymerization inhibition by air will be reduced. This layer serves not only to provide an oxygen-sealing function but also to suppress scratches or the like and thus to improve the handling efficiency, and it is preferred to form such a protective layer.

A laser exposure machine which generates a laser beam ranging from a near infrared laser beam to an infrared laser beam, is employed for exposure to form an image by means of the photosensitive composition or the image-forming material of the present invention. A preferred range of the wavelength of such a laser beam is from 780 to 1,200 nm. As such a laser exposure machine, a semiconductor laser or a solid state laser such as YAG, may presently be available. A laser of from 780 to 880 nm is particularly advantageous. For the image forming, scanning for exposure is carried out along an image pattern based on digital information from a computer, whereby the exposed portion will be cured.

Development can be carried out by contact with a liquid which is capable of dissolving the unexposed portion. As such a liquid, the same organic solvent as used for the preparation of the above-mentioned photosensitive liquid, may be used but preferred is an aqueous alkali solution. The aqueous alkali solution may, for example, be an aqueous solution containing from 0.1 to 10 wt % of an inorganic alkali such as sodium hydroxide, potassium hydroxide, sodium carbonate, sodium hydrogencarbonate, potassium carbonate, potassium hydrogencarbonate, sodium phosphate, potassium phosphate, sodium silicate, potassium silicate, lithium silicate, ammonium silicate, sodium metasilicate or potassium metasilicate, or an organic alkali such as triethanolamine, diethanolamine, monoethanolamine, trimethanolamine, dimethanolamine, monomethanolamine, tetramethylammonium hydroxide, tetraethylammonium hydroxide or pyridine. The aqueous alkali solution may contain a small amount of an additive such as a surfactant, an organic solvent or a defoaming agent in order to improve the function such as the developing property. Addition of a surfactant is preferred, since it brings about a good result in many cases for the improvement of the developing property or for reducing the background staining. As such a surfactant, a known nonionic, anionic, cationic or betaine type surfactant may be mentioned.

The developing method is not particularly limited, and various methods may be employed, such as spin development, paddle development, dip development and spray development.

After the development, post baking or post exposure may be applied, as the case requires. By such post treatment, the crosslinking density and the adhesion can be improved to improve the printing resistance and etching resistance.

Now, the present invention will be described in further detail with reference to Examples. However, it should be understood that the present invention is by no means restricted to such specific Examples.

PREPARATION EXAMPLE 1

Preparation of a Resin 140 g of benzyl methacrylate, 17 g of methacrylic acid, 200 g of ethanol and 1.5 g of azoisobutyronitrile were mixed and heated by an oil bath and reacted under reflux for 8 hours in a nitrogen atmosphere. This reaction solution was reprecipitated in pure water to obtain a benzyl methacrylate/methacrylic acid copolymer resin. Neutralizing titration was carried out with KOH, whereby the acid value of the resin was 70 mg.KOH/g. Further, the weight average molecular weight Mw was 40,000, the number average molecular weight Mn was 10,000 and the molecular weight distribution Mw/Mn was 4.

EXAMPLE 1

The following components were mixed in the following proportions to obtain a photosensitive liquid composition.

|  | (parts by weight) |
|---|---|
| 1) Resin of Preparation Example 1 | 100 |
| 2) Dipentaerythritol hexaacrylate (DPHA) | 100 |
| 3) Sensitizing dye (above-mentioned R-3) | 5 |
| 4) Photopolymerization initiator (above-mentioned B-1) | 5 |
| 5) Cyclohexanone | 1,500 |
| 6) FC-430 (fluorine type surfactant, manufactured by Sumitomo 3M K.K.) | 0.1 |

Evaluation of Image-Forming Performance and Safe Light Property

The above photosensitive liquid was coated on an anodized aluminum substrate having a size of 400×250 mm in a thickness of 0.2 mm by a wire bar. It was dried at 70° C. for 2 minutes in a convection oven. The thickness of the photosensitive layer after drying was about 1 $\mu$m. On the photosensitive layer, a 10 wt % aqueous solution of polyvinyl alcohol was coated in a thickness of 1 $\mu$m in the same manner, as a protective film.

This substrate was cut into a size of 100×50 mm and attached to an aluminum roller having a diameter of 100 mm. While rotating this aluminum roller at a rate of 5 rpm by a motor, exposure was carried out by a semiconductor laser beam having a laser spot diameter of about 10 $\mu$m with an output power of 40 mW and an irradiation wavelength of 830 nm.

The substrate was detached from the roller and subjected to dip development at 25° C. for 1 minute with an alkali developer containing 3 wt % of potassium silicate and 5 wt % of Perex NBL (surfactant, manufactured by Kao Corporation), and then it was rinsed with pure water and dried by pressurized air. This substrate was inspected by a magnifier with 60 magnifications (image forming performance 1), whereby a clear image of 10 $\mu$m was obtained. The above operation was carried out under yellow light.

Further, the substrate coated with the photosensitive layer was left to stand for 1 hour under a fluorescent lamp, whereupon evaluation was carried out in the same manner (safe light property), whereby a clear pattern of 10 $\mu$m was obtained which was the same as obtained above, whereby it was confirmed that the photosensitive layer had a safe light property against white light.

Evaluation of Stability

The photosensitive liquid was stored at room temperature for 3 days, whereby presence or absence of precipitation was visually observed (stability of the photosensitive liquid), whereby no precipitation was observed. Further, using this photosensitive liquid, image formation was carried out (image forming performance 2) under the same conditions as above, whereby a clear pattern of 10 $\mu$m was obtained which was the same as obtained above, whereby the stability was good.

EXAMPLE 2

Evaluation was carried out in the same manner as in Example 1 except that the sensitizing dye in the photosensitive liquid composition in Example 1 was changed to the above-mentioned R-11, whereby with respect to all of the image-forming performance, the safe light property and the stability of the photosensitive liquid, good results similar to Example 1 were obtained.

EXAMPLE 3

Evaluation was carried out in the same manner as in Example 1 except that the photopolymerization initiator in the photosensitive liquid composition in Example 1 was changed to the above-mentioned B-6, whereby with respect to all of the image-forming performance, the safe light property and the stability of the photosensitive liquid, good results similar to Example 1 were obtained.

EXAMPLE 4

Evaluation was carried out in the same manner as in Example 1 except that the in the photosensitive liquid composition in Example 1, the sensitizing dye was changed to the above-mentioned R-11, and the photopolymerization initiator was changed to the above B-6, whereby with respect to all of the image-forming performance, the safe light property and the stability of the photosensitive liquid, good results similar to Example 1 were obtained.

COMPARATIVE EXAMPLE 1

Evaluation was carried out in the same manner as in Example 1 except that in the photosensitive liquid composition in Example 1, the sensitizing dye was changed to CY-10 (cyanine dye, manufactured by Nippon Kayaku K.K.; $\lambda_{max}$=787 nm), whereby even the exposed portion dissolved in the developer, and it was not possible to form an image. Further, the photosensitive liquid was stored for 3 days to examine the stability, whereby formation of precipitates was observed, and the stability was poor.

COMPARATIVE EXAMPLE 2

Evaluation was carried out in the same manner as in Example 1 except that in the photosensitive liquid composition in Example 1, the sensitizing dye was changed to CY-10 (cyanine dye, manufactured by Nippon Kayaku K.K.; $\lambda_{max}$=787 nm) and the photopolymerization initiator was changed to TAZ-110 (triazine type initiator, manufactured by Midori Kagaku K.K.), whereby even the exposed portion dissolved in the developer, and it was not possible to form an image. Further, the photosensitive liquid was stored for 3 days to examine the stability, whereby formation of precipitates was observed, and the stability was poor.

COMPARATIVE EXAMPLE 3

Evaluation was carried out in the same manner as in Example 1 except that in the photosensitive liquid composition in Example 1, the sensitizing dye was changed to the following MIR-101 (Ni complex type infrared absorbing dye, manufactured by Midori Kagaku K.K.; $\lambda_{max}$=850 nm), whereby even the exposed portion dissolved in the developer, and it was not possible to form an image.

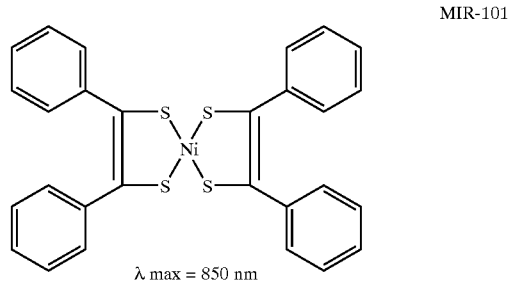

MIR-101

λ max = 850 nm

COMPARATIVE EXAMPLE 4

Evaluation was carried out in the same manner as in Example 1 except that in the photosensitive liquid composition in Example 1, the sensitizing dye was changed to CIR-960 (aluminum type infrared absorbing dye, manufactured by Nippon Carlit Co., Ltd.; $\lambda_{max}$=955 nm), whereby even the exposed portion dissolved in the developer, and it was impossible to form an image.

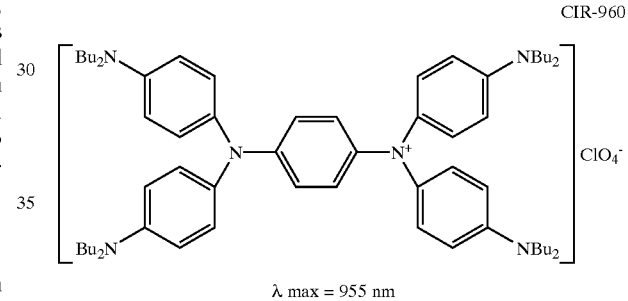

CIR-960

λ max = 955 nm

The above results are summarized in Table 1.

TABLE 1

|  | Ex. 1 | Ex. 2 | Ex. 3 | Ex. 4 | Comp. Ex. 1 | Comp. Ex. 2 | Comp. Ex. 3 | Comp. Ex. 4 |
|---|---|---|---|---|---|---|---|---|
| Resin | Preparation Example 1 | Preparation Example 1 | Preparation Example 1 | Preparation Example 1 | Preparation Example 1 | Preparation Example 1 | Preparation Example 1 | Preparation Example 1 |
| Ethylenically unsaturated compound | DPHA | DPHA | DPHA | DPHA | DPHA | DPHA | DPHA | DPHA |
| Sensitizing dye *1 | R-3 | R-11 (V) | R-3 | R-11 (Zn) | CY-10 | CY-10 | MIR-101 | CIR-960 |
| Photopolymerization initiator *2 | B-1 | B-1 | B-6 | B-6 | B-1 | TAZ-110 | B-1 | B-1 |
| Image-forming performance 1 *3 | ○ | ○ | ○ | ○ | X | X | X | X |
| Safe light property *4 | ○ | ○ | ○ | ○ | — | — | — | — |
| Stability of photosensitive liquid *5 | ○ | ○ | ○ | ○ | X | X | — | — |

TABLE 1-continued

|  | Ex. 1 | Ex. 2 | Ex. 3 | Ex. 4 | Comp. Ex. 1 | Comp. Ex. 2 | Comp. Ex. 3 | Comp. Ex. 4 |
|---|---|---|---|---|---|---|---|---|
| Image-forming performance 2 *6 | ○ | ○ | ○ | ○ | — | — | — | — |

*1: In the brackets ( ), the central metal is indicated.
R-3, R-11: Phthalocyanine dyes
CY-10: Cyanine dye
MIR-101: Ni complex type infrared absorbing dye
CIR-960: Aluminum type-infrared absorbing dye
*2: B-1, B-6: Organic boron complexes
TAZ-110: Triazine type compound
*3: Formation of a clear image of 10 μm at a drum rotational speed of 5 rpm
○ Yes
X No
— Not evaluated
*4: Formation of a clear image of 10 μm after being left for 1 hour under a flourescent lamp.
○ Yes
X No
— Not evaluated
*5: Precipitation in the photosensitive liquid during the storage for 3 days.
○ No
X Yes
— Not evaluated
*6: Formation of a celar image of 10 μm at a drum rotational speed of 5 rpm when the photosensitive liquid stored for 3 days was used.
○ No
X Yes
— Not evaluated

PREPARATION EXAMPLE 2

Preparation of a Resin Having Double Bonds in Its Side Chains 20 g of a styrene/acrylic acid resin having an acid value of 200 and a weight average molecular weight of 5,000, 0.2 g of p-methoxyphenol, 0.2 g of dodecyltrimethylammonium chloridie, and 40 g of propylene glycol monomethyl ether acetate (PGMEA) were charged into a flask, and 7.6 g of (3,4-epoxycyclohexyl)methyl acrylate was dropwise added and reacted for 30 hours at a temperature of 100° C. The reaction solution was reprecipitated in water and dried to obtain a resin. Neutralization titration by KOH was carried out, whereby the acid value of the resin was 80 mg KOH/g. Further, the molecular weight was measured by GPC, whereby the weight average molecular weight Mw was 8,000, the number average molecular weight Mn was 3,000, and the molecular weight distribution Mw/Mn was 2.7.

EXAMPLE 5 and COMPARATIVE EXAMPLES 5 and 6

The following components were mixed in the following proportions to obtain a photosensitive liquid composition.

|  | (parts by weight) |
|---|---|
| 1) Resin of Preparation Example 2 | 100 |
| 2) Dipentaerythritol hexaacrylate (DPHA) | 100 |
| 3) Infrared absorbing dye (as identified in Table 2) | 5 |
| 4) Photopolymerization initiator (as identified in Table 2) | 5 |
| 5) Cyclohexanone | 1,500 |
| 6) FC-430 (fluorine type surfactant, manufactured by Sumitomo 3M K.K.) | 0.1 |

1. Evaluation of Image Properties

The above photosensitive liquid was coated on an aluminum substrate having a thickness of 0.2 mm and a size of 400×250 mm by a wire bar, followed by drying at 70° C. for 2 minutes in a convection oven. The thickness of the photosensitive layer after drying was about 1 μm. On the photosensitive layer, a 10 wt % aqueous solution of polyvinyl alcohol was coated in a thickness of 1 μm in the same manner, as a protective layer.

This substrate was cut out in a size of 100×50 mm and attached to an aluminum roller having a diameter of 100 mm. While rotating this aluminum roller at a rate of 100 rpm by a motor, exposure was carried out by a semiconductor laser beam having a wavelength of 830 nm and a laser spot diameter of about 10 μm with a output power of 40 mW.

The substrate was detached from the roller and subjected to dip development at 25° C. for 1 minutes with an alkali developer containing 0.5 wt % of potassium hydroxide and 1 wt % of Emulgen A-60 (a surfactant, manufactured by Kao Corporation), followed by rinsing with pure water and drying by pressurized air. This substrate was inspected by a magnifier with 60 magnifications. The image property was evaluated on the basis of whether or not a clear image was formed. The above operation was carried out under yellow light. The image property was evaluated to be good when a clear image was formed.

2. Stability of the Photosensitive Liquid

Each photosensitive liquid was stored at room temperature for 3 days, whereby presence or absence of precipitation was visually observed to evaluate the stability. The stability was evaluated to be good when no precipitation formed.

3. Adhesion

An adhesive tape was brought in close contact with the formed pattern, and this adhesive tape was peeled, whereby good or bad of the adhesion was evaluated on the basis of whether peeling of the pattern from the substrate was observed. The adhesion was evaluated to be good when no peeling from the substrate was observed and evaluated to be bad when peeling was observed even a little.

The results are shown in Table 2

The abbreviations used in Table 2 represent compounds of the above-mentioned structures or the following compounds.

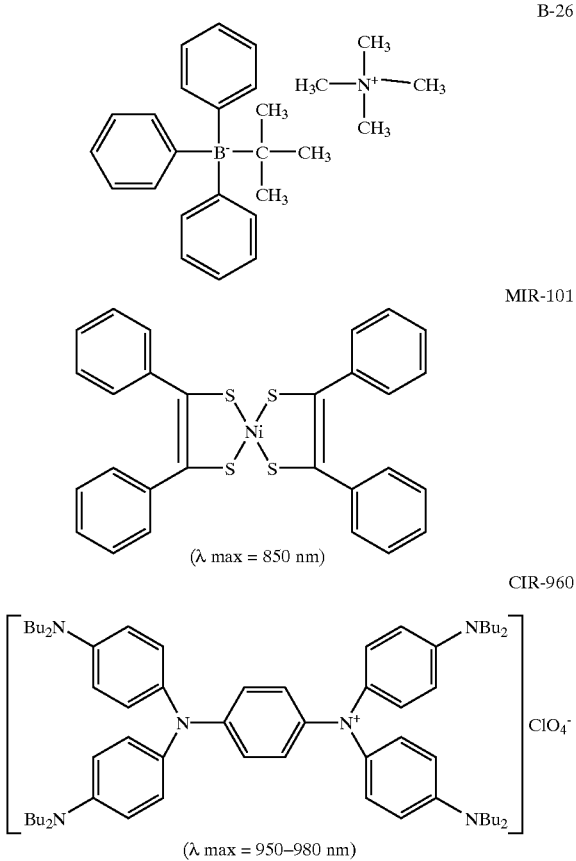

IRG-907: Polymerization initiator (acetophenone type), manufactured by Ciba Geigy IRG-369: Polymerization initiator (acetophenone type), manufactured by Ciba Geigy

TABLE 2

| Resin | Example 5 Preparation Example 2 | Comparative Example 5 Preparation Example 1 | Comparative Example 6 Preparation Example 1 |
|---|---|---|---|
| Infrared absorbing dye | IR-3 (V) | MIR-101 | CIR-960 |
| Polymerization initiator | B-26 | IRG907 | IRG369 |
| Image property | Good | Bad (impossible to form an image) | Bad (impossible to form an image) |
| Stability of the photosensitive liquid | Good | Good | Good |
| Adhesion | Good | Bad | Bad |

EXAMPLE 6

Preparation of a Support

An aluminum plate according to JIS 1050 having a thickness of 0.24 mm was degreased by a 3 wt % sodium hydroxide aqueous solution, and the degreased plate was subjected to electrolytic etching for 11 seconds in a 11.5 g/λ hydrochloric acid bath at a current density of 80 A/dm², then washed with water and subjected to anodizing for 15 seconds in a 30 wt % sulfuric acid bath at 30° C. at a current density of 11.5 A/dm². The centerline average roughness Ra on the surface of the obtained support was measured by a surface roughness meter ("Surfcoder SE-30H", manufactured by Kosaka Kenkyusho) and was found to be 0.6 μm.

Preparation of a Photosensitive Printing Plate

On the above support, a photosensitive composition coating liquid having the following composition was coated by a bar coater so that the dried film thickness would be 2 μm, followed by drying. Further, an aqueous polyvinyl alcohol solution was coated thereon by a bar coater so that the dried film thickness would be 3 μm, followed by drying to obtain a photosensitive lithographic printing plate, which was evaluated by the following methods.

Composition of the Photosensitive Composition Coating Liquid

|  | (parts by weight) |
|---|---|
| 1) Resin of Preparation Example 2 | 100 |
| 2) Urethane (meth)acrylate compound (the above-mentioned M-1) | 100 |
| 3) Phthalocyanine compound (The above-mentioned R-11) | 5 |
| 4) Polymerization initiator (the above-mentioned B-1) | 10 |
| 5) Cyclohexanone | 1,500 |
| 6) Surfactant ("S-381", manufactured by Dainippon Ink K.K.) | 0.1 |

Sensitivity and Image Property

The obtained photosensitive printing plate was attached to a rotary drum made of aluminum having a diameter of 10 cm and secured so that the photosensitive layer was located outside. Then, while rotating the drum, the surface of the photosensitive layer was exposed with a semiconductor laser having a wavelength of 830 nm with an output power of 40 mW ("HL8325C", manufactured by Hitachi Ltd.) with a beam spot diameter of 30 μm. The rotational speed was set at four levels of 5 rpm, 50 rpm, 100 rpm and 200 rpm.

Development was carried out by dipping at 25° C. for 1 minute in an alkali developer containing 3 wt % of potassium silicate and 5 wt % of Perex NBL (surfactant, manufactured by Kao Corporation).

The obtained image was inspected by a magnifier with 100 magnifications, whereby at a drum rotational speed of from 5 rpm to 200 rpm, an image having a line width of 30 μm with a sharp edge was obtained.

Further, no background staining was observed at the non-image portion.

Printing Property, Chemical Resistance and Adhesion

The above image sample was immersed in a wetting liquid ("Etching Liquid SG-51", manufactured by Tokyo Ink K.K., concentration: 1.5 wt %) at 25° C. for 1 hour, where-upon an adhesive tape peeling test was carried out. In the adhesive tape peeling test, no peeling of the image from the support was observed, and the sample was found to have good adhesion and chemical resistance, and the printing property was also good.

Safe Light Property

The photosensitive printing plate was left to stand for 3 hours in a room irradiated by a white fluorescent lamp, whereupon exposure and development were carried out under the same conditions as above, whereupon no fogging by white light was observed, and an image of 30 μm with a sharp edge was obtained from 5 rpm to 200 rpm, whereby the safe light property was found to be good.

EXAMPLE 7

A photosensitive printing plate was prepared in the same manner as in Example 6 except that in the photosensitive composition coating liquid in Example 6, the urethane (meth)acrylate compound was changed to the above-mentioned M-4, and evaluation was carried out in the same manner, whereby with respect to all of the sensitivity, image property, adhesion, chemical resistance and safe light property, good results similar to Example 6 were obtained.

EXAMPLE 8

A photosensitive printing plate was prepared in the same manner as in Example 6 except that in the photosensitive composition coating liquid in Example 6, the phthalocyanine compound was changed to the above-mentioned R-12, and evaluation was carried out in the same manner, whereby with respect to all of the sensitivity, image property, adhesion, chemical resistance and safe light property, good results similar to Example 6 were obtained.

EXAMPLE 9

A photosensitive printing plate was prepared in the same manner as in Example 8 except that in the photosensitive composition coating liquid in Example 8, the urethane (meth)acrylate compound was changed to the above-mentioned M-4, and evaluation was carried out in the same manner, whereby with respect to all of the sensitivity, image property, adhesion, chemical resistance and safe light property, good results similar to Example 8 were obtained.

COMPARATIVE EXAMPLE 7

Preparation and evaluation of a photosensitive printing plate were carried out in the same manner as in Example 6 except that in Example 6, instead of a phthalocyanine compound in the photosensitive composition coating liquid, a cyanine dye ("CY-17", manufactured by Nippon Kayaku K.K.) was employed, whereby even at a drum rotational speed of 5 rpm, the image portion was dissolved by the developer, and no image was obtained.

COMPARATIVE EXAMPLE 8

Preparation and evaluation of a photosensitive printing plate were carried out in the same manner as in Example 6 except that in Example 6, instead of the phthalocyanine compound in the photosensitive composition coating liquid, a cyanine dye ("CY-10", manufactured by Nippon Kayaku K.K.) was employed, whereby even at a drum rotational speed of 5 rpm, the image portion was dissolved by the developer, and no image was obtained.

COMPARATIVE EXAMPLE 9

Preparation and evaluation of a photosensitive printing plate were carried out in the same manner as in Example 6 except that in Example 6, instead of the phthalocyanine compound in the photosensitive composition coating liquid, a polymethine dye ("IR-820B", manufactured by Nippon Kayaku K.K.) was employed, whereby only at a drum rotational speed of 5 rpm, an image of 30 $\mu$m with a sharp edge was obtained, but when the rotational speed was high, no sharp image was obtained. Further, the safe light property was poor (an image residue was observed at the non-image portion after the development), although the chemical resistance, adhesion and printing property were good.

EXAMPLE 10

Preparation and evaluation of a photosensitive printing plate were carried out in the same manner as in Example 6 except that in Example 6, instead of the urethane (meth)acrylate compound in the photosensitive composition coating liquid, ethylene glycol diacrylate ("9G", manufactured by Shin Nakamura Kagaku K.K.) was used as an ethylenically unsaturated double bond compound, whereby only at a drum rotational speed of 5 rpm, an image was formed, but at the non-image portion, the background staining which was not removed by the development, was observed.

Further, the safe light property was poor (an image residue was observed at the non-image portion after the development).

The above results will be summarized in Table 3.

TABLE 3

| | Ex. 6 | Ex. 7 | Ex. 8 | Ex. 9 | Ex. 10 | Comp. Ex. 7 | Comp. Ex. 8 | Comp. Ex. 9 |
|---|---|---|---|---|---|---|---|---|
| Resin | Preparation Example 2 | Preparation Example 2 | Preparation Example 2 | Preparation Example 2 | Preparation Example 2 | Preparation Example 2 | Preparation Example 2 | Preparation Example 2 |
| Ethylenically unsaturated compound *1 | M-1 (urethane) | M-4 (urethane) | M-1 | M-4 | 9G | M-1 | M-1 | M-1 |
| Sensitizing dye *2 | R-11 (Zn) | R-11 (Zn) | R-12 (Sn) | R-12 | R-11 (Zn) | CY-17 | CY-10 | IR-820B |
| Photopolymerization initiator *3 | B-1 | B-1 | B-1 | B-1 | B-1 | B-1 | B-1 | B-1 |
| Ra ($\mu$m) | 0.6 | 0.6 | 0.6 | 0.6 | 0.6 | 0.6 | 0.6 | 0.6 |
| Sensitivity *4 | ⊚ | ⊚ | ⊚ | ⊚ | Δ | X | X | Δ |
| Image property *5 | ○ | ○ | ○ | ○ | X | — | — | ○ |
| Printing property *6 | ○ | ○ | ○ | ○ | — | — | — | ○ |

TABLE 3-continued

|  | Ex. 6 | Ex. 7 | Ex. 8 | Ex. 9 | Ex. 10 | Comp. Ex. 7 | Comp. Ex. 8 | Comp. Ex. 9 |
|---|---|---|---|---|---|---|---|---|
| Safe light property *7 | ○ | ○ | ○ | ○ | X | — | — | X |

*1: M-1, M-4: Urethane type compounds
9G: Ethylene glycol type compound
*2: R-11, R-12: Phthalocyanine type dyes
In the brackets ( ), the central metal is indicated.
CY-17, C-10: Cyanine type dyes
IR-820B: Polymethine type dye
*3: B-1: Organic boron complex
*4: Drum rotational speed at which an image of 30 μm with a sharp edge can be obtained.
⊚: 50 to 200 rpm
○: 5 to 100 rpm
Δ: 5 rpm
X: Impossible to form an image at 5 rpm
*5: ○: No background staining
X: Background staining observed
*6: ○: No peeling of the image from the support observed
X: Peeling of the image from the support observed
*7: Image property after being left for 3 hours under white light
⊚: Same as before being left to stand
X: Image residue was observed at the non-image portion after development

EXAMPLE 11

A photosensitive lithographic printing plate was prepared in the same manner as in Example 6 except that the following photosensitive composition coating liquid was used, and evaluation was carried out by the following methods.

Photosensitive Composition Coating Liquid

|  | (parts by weight) |
|---|---|
| Resin of Preparation Example 2 | 100 |
| Ethylenically unsaturated double bond Compound: the above-mentioned A-1 (provided $R^o$ = H) | 50 |
| Acryloyldiethyleneoxide adduct of 2,2-Bis (4-hydroxyphenyl)propane | 50 |
| Phthalocyanine compound R-11 | 5 |
| Photopolymerization initiator B-1 | 10 |
| Cyclohexanone | 500 |
| Surfactant S-381 | 0.1 |

Image Property

The obtained photosensitive printing plate was attached to a rotary drum made of aluminum having a diameter of 10 cm and secured so that the photosensitive layer was located outside. Then, while rotating the drum, the surface of the photosensitive layer was exposed by a semiconductor laser having a wavelength of 830 nm with an output power of 40 mW ("HL8325C", manufactured by Hitachi Ltd.) with a beam spot diameter of 30 μm. The rotational speed was set at 5 rpm.

Development was carried out by dipping at 25° C. for 1 minute in an alkali developer containing 3 wt % of potassium silicate and 5 wt % of Perex NBL (surfactant, manufactured by Kao Corporation).

The obtained image was observed by a magnifier with 100 magnifications, whereby an image having a line width of 30 μm with a sharp edge, was obtained (sensitivity).

On the other hand, for the background staining of a non-image portion, the reflection absorbance was measured by means of a reflection densitometer ("RD-514", manufactured by Macbeth Co.) without a filter, and the background staining remaining on the support was evaluated by the following standards, from a value obtained by subtracting from the measured value a value of the reflection absorbance of the support surface prior to coating the photosensitive composition.

A: The reflection absorbance is less than 0.02.
B: The reflection absorbance is at least 0.02 and less than 0.04.
C: The reflection absorbance is at least 0.04 and less than 0.06.
D: The reflection absorbance is at least 0.06.

The result was A, and good developability was obtained without the background staining at the non-image portion.

Safe Light Property

The photosensitive printing plate was left to stand for 3 hours in a room irradiated by a white fluorescent lamp, followed by exposure and development under the same conditions as described above, whereby no fogging by white light was observed, and an image of 30 μm with a sharp edge, was obtained, whereby the safe light property was found to be good. Further, no background staining was observed at the non-image portion.

Stability

The photosensitive printing plate was left to stand at 55° C. for 3 days, and then exposure and development were carried out under the same conditions as above, whereby an image having a line width of 30 μm with a sharp edge, was obtained, and no background staining was observed.

EXAMPLE 12

The image property, safe light property and stability were evaluated in the same manner as in Example 11 except that in the photosensitive composition coating liquid in Example 11, the phthalocyanine compound was changed to R-12. The image property was good, as an image having a line width of 30 μm with a sharp edge, was obtained, and background staining at the non-image portion was evaluated to be A rank. Further, the safe light property and the stability were also good.

EXAMPLE 13

The image property, safe light property and stability were evaluated in the same manner as in Example 11, except that in the photosensitive composition coating liquid in Example 11, the ethylenically unsaturated double bond compound was changed to 80 parts by weight of hexamethylenebis [tris(acryloyloxymethyl)ethylurethane] and 20 parts by weight of a 1:1 mixture of methacryloyloxyethyl phosphate and bis(methacryloyloxyethyl)phosphate. The image property was good, as an image having a line width of 30 μm with a sharp edge, was obtained, and background staining at the non-image portion was evaluated to be A rank. Further, the safe light property and the stability were also good.

EXAMPLE 14

The image property, safe light property and stability were evaluated in the same manner as in Example 13 except that in the photosensitive composition coating liquid in Example 13, the phthalocyanine compound was changed to R-12. The image property was good, as an image having a line width of 30 μm with a sharp edge, was obtained, and background staining at the non-image portion was evaluated to be A rank. Further, the safe light property and the stability were also good.

EXAMPLE 15

The image property, safe light property and stability were evaluated in the same manner as in Example 11 except that in the photosensitive composition coating liquid in Example 11, the initiator was changed to 2-(p-methoxystyryl)-4,6-bis (trichloromethyl)-s-triazine (S-1). The image property was good, as an image having a line width of 30 μm with a sharp edge was obtained, and background staining at the non-image portion was evaluated to be A rank. Further, the safe light property and the stability were also good.

EXAMPLE 16

A photosensitive printing plate was prepared under the same conditions as in Example 11 except that in the photosensitive composition coating liquid in Example 11, the ethylenically unsaturated double bond compound was changed to ethylene glycol diacrylate (9G, manufactured by Shin Nakamura Kagaku K.K.), and evaluation was carried out in the same manner as in Example 11, whereby an image having a line width of 30 μm with a sharp edge, was formed. However, background staining at the non-image portion was poor at a level of C rank. Further, in the safe light test and the stability test, the background staining further deteriorated to a level of D rank.

COMPARATIVE EXAMPLE 9

A photosensitive printing plate was prepared under the same conditions as in Example 11 except that in the photosensitive coating liquid in Example 11, the phthalocyanine compound was changed to a cyanine dye (CY-17, manufactured by Nippon Kayaku K.K.), and evaluation was carried out in the same manner as in Example 11, whereby the image portion was dissolved by the developer, and no image was formed.

COMPARATIVE EXAMPLE 10

A photosensitive printing plate was prepared under the same conditions as in Example 11 except that in the photosensitive composition coating liquid in Example 11, the phthalocyanine compound was changed to a cyanine dye (CY-10, manufactured by Nippon Kayaku K.K.), and evaluation was carried out in the same manner as in Example 11, whereby the image portion was dissolved by the developer, and no image was formed.

The above results will be summarized in Table 4.

TABLE 4

|  | Ex. 11 | Ex. 12 | Ex. 13 | Ex. 14 | Ex. 15 | Ex. 16 | Comp. Ex. 10 | Comp. Ex. 11 |
| --- | --- | --- | --- | --- | --- | --- | --- | --- |
| Resin | Preparation Example 2 | Preparation Example 2 | Preparation Example 2 | Preparation Example 2 | Preparation Example 2 | Preparation Example 2 | Preparation Example 2 | Preparation Example 2 |
| Ethylenically unsaturated compound *1 | A-1 | A-1 | Mixture of urethane type and phosphate type | Mixture of urethane type and phosphate type | A-1 | 9G | A-1 | A-1 |
| Sensitizing dye *2 | R-11 (Zn) | R-12 (Sn) | R-11 | R-12 | R-11 | R-11 | CY-17 | CY-10 |
| Photopolymerization initiator *3 | B-1 | B-1 | B-1 | B-1 | S-1 | B-1 | B-1 | B-1 |
| Sensitivity *4 | ○ | ○ | ○ | ○ | ○ | ○ | X | X |
| Background staining | A | A | A | A | A | C | — | — |

TABLE 4-continued

|  | Ex. 11 | Ex. 12 | Ex. 13 | Ex. 14 | Ex. 15 | Ex. 16 | Comp. Ex. 10 | Comp. Ex. 11 |
|---|---|---|---|---|---|---|---|---|
| Safe light property *5 | ◯ | ◯ | ◯ | ◯ | ◯ | X | — | — |
| Stability *6 | ◯ | ◯ | ◯ | ◯ | ◯ | X |  |  |

*1: A-1: Acryloyloxyalkyl group-containing amine compound
9G: Ethylene glycol type compound
*2: R-11, R-12, in the brackets ( ), the central metal is indicated.
CY-11, CY-17: Cyanine type dyes
*3: B-1: Organic boron complex
S-1: Halomethyltriazine compound
*4: Formation of a clear image of 30 μm at a drum rotational speed of 5 rpm
◯: Yes
X: No
*5: Sensitivity and background staining after being left for 3 hours under a white fluorescent lamp
◯: Same as before being left to stand
X: Poorer than before being left to stand
*6: Sensitivity and background staining after the photosensitive printing plate was left to stand at 55° C. for 3 days
◯: Same as before being left to stand
X: Poorer than before being left to stand, and background staining being D level

EXAMPLE 17

A photosensitive lithographic printing plate was prepared in the same manner as in Example 6 except that the following photosensitive composition coating liquid was employed, and evaluation was carried out by the following methods.

Composition of Photosensitive Composition Coating Liquid

|  | (parts by weight) |
|---|---|
| Resin of Preparation Example 2 | 100 |
| Dipentaerythritol hexaacrylate (DPHA) | 100 |
| Phthalocyanine compound (the above-mentioned R-11) | 5 |
| Polymerization initiator (the above-mentioned B-1) | 10 |
| Cyclohexanone | 1,500 |
| Surfactant ("S-381", manufactured by Dainippon Ink K.K. | 0.1 |

Sensitivity and Image Property

The sensitivity and the image property were evaluated in the same manner as in Example 6, whereby an image having a line width of 30 μm with a sharp edge, was obtained at a drum rotational speed of from 5 rpm to 200 rpm.

Further, no background staining at the non-image portion was observed.

Printing Property, Chemical Resistance and Adhesion

The printing property was evaluated in the same manner as in Example 6, whereby in the adhesive peeling test, no peeling of the image from the support was observed, and the sample was found to have good adhesion and chemical resistance, and the printing property was also good.

Safe Light Property

The safe light property was evaluated in the same manner as in Example 6 except that the time for being left to stand was changed from 3 hours to 1 day, whereby no fogging by white light was observed, and an image having a line width of 30 μm with a sharp edge was obtained at a rotational speed of from 5 rpm to 200 rpm, and the safe light property was found to be good.

Storage Stability

The photosensitive printing plate was stored at 25° C. for 2 months in a light-shielding state, and then subjected to exposure and development under the same conditions as for the evaluation of the sensitivity and the image property, whereby an image having a line width of 30 μm with a sharp edge was obtained at a rotational speed of from 5 rpm to 200 rpm, and the storage stability was found to be good.

EXAMPLE 18

An anodized aluminum support was prepared under the same conditions as for the support in Example 6 except that in the preparation of the support, the electrolytic etching time was changed to 8 seconds. The centerline average roughness (Ra) of the surface of this support was 0.4 μm. On this support, a photosensitive layer and a protective layer were formed in the same manner as in Example 17 to obtain a photosensitive printing plate, and evaluation was carried out in the same manner as in Example 17, whereby with respect to all of the sensitivity, image property, adhesion, chemical resistance, safe light property and storage stability, good results similar to Example 17 were obtained.

EXAMPLE 19

An anodized aluminum support was prepared under the same conditions for the support in Example 6 except that in the preparation of the support, the electrolytic etching time was changed to 13 seconds. The centerline average roughness (Ra) of the surface of this support was 0.8 μm. On this support, a photosensitive layer and a protective layer were formed in the same manner as in Example 17 to obtain a photosensitive printing plate, and evaluation was carried out in the same manner as in Example 17, whereby with respect to all of the sensitivity, image property, adhesion, chemical resistance, safe light property and storage stability, good results similar to Example 17 were obtained.

EXAMPLE 20

A photosensitive printing plate was prepared in the same manner as in Example 17, except that the dipentaerythritol hexaacrylate in the photosensitive composition coating liquid was changed to a reaction product of hexamethylene diisocyanate with pentaerythritol triacrylate, and evaluation was carried out in the same manner, whereby with respect to all of the sensitivity, image property, adhesion, chemical resistance, safe light property and storage stability, good results similar to Example 17 were obtained.

EXAMPLE 21

Preparation and evaluation of a photosensitive printing plate were carried out in the same manner as in Example 17 except that as the support, a copper plate having a thickness of 0.2 mm and a centerline average roughness (Ra) of the surface being 0.8 μm, was employed, whereby an image having a line width of 30 μm with a sharp edge was obtained at a drum rotational speed of from 5 rpm to 100 rpm. However, as compared with Example 1, the sensitivity was inferior, although the image property was equivalent.

Further, the image sample was immersed in a wetting liquid ("etching liquid SG-51", manufactured by Tokyo Ink K.K., concentration: 1.5 wt %) at 25do for 1 hour and then subjected to an adhesive tape peeling test, whereby the image portion was peeled, and the chemical resistance, adhesion and printing property were poor. The storage stability was poor, although good results were obtained with respect to the safe light property.

COMPARATIVE EXAMPLE 12

Preparation and evaluation of a photosensitive printing plate were carried out in the same manner as in Example 17 except that in Example 17, instead of the phthalocyanine compound in the photosensitive composition coating liquid, a cyanine dye ("CY-10", manufactured by Nippon Kayaku K.K.) was employed, whereby no image was obtained.

REFERENCE EXAMPLE 1

Preparation and evaluation of a photosensitive printing plate were carried out in the same manner as in Example 17 except that in Example 17, instead of the phthalocyanine compound in the photosensitive composition coating liquid, a polymethine dye ("IR-820B", manufactured by Nippon Kayaku K.K.) was employed, whereby an image having a line width of 30 μm with a sharp edge-was obtained only at a drum rotation speed of 5 rpm, but when the rotational speed was high, no sharp image was obtainable. Further, the safe light property was poor (image residue remained at the non-image portion after development), and the storage stability was poor (the sensitivity decreased to a level of not higher than ½), although the chemical resistance, adhesion and printing property were good.

The above results will be summarized in Table 5.

TABLE 5

| | Ex. 17 | Ex. 18 | Ex. 19 | Ex. 20 | Ex. 21 | Comp. Ex. 12 | Ref. Ex. 1 |
|---|---|---|---|---|---|---|---|
| Resin | Preparation Example 2 | Preparation Example 2 | Preparation Example 2 | Preparation Example 2 | Preparation Example 2 | Preparation Example 2 | Preparation Example 2 |
| Ethylenically unsaturated compound | DPHA | DPHA | DPHA | Urethane type | DPHA | DPHA | DPHA |
| Sensitizing dye *1 | R-11 (Zn) | R-11 (Zn) | R-11 (Zn) | R-11 (Zn) | R-11 (Zn) | CY-10 | IR-820B |
| Photopolymerization initiator *2 | B-1 | B-1 | B-1 | B-1 | B-1 | B-1 | B-1 |
| Ra (μm) | 0.6 | 0.4 | 0.8 | 0.6 | 0.8 | 0.6 | 0.6 |
| Sensitivity *3 | ◎ | ◎ | ◎ | ◎ | ○ | X | Δ |
| Image property *4 | ○ | ○ | ○ | ○ | — | — | — |
| Printing property *5 | ○ | ○ | ○ | ○ | X | — | ○ |
| Safe light property *6 | ○ | ○ | ○ | ○ | ○ | — | X |
| Storage stability of the photosensitive printing plate *7 | ○ | ○ | ○ | ○ | X | — | X |
| Support | Aluminum | Aluminum | Aluminum | Aluminum | Copper | Aluminum | Aluminum |

*1: R-11: Phthalocyanine dye
*2: B-1: Organic boron complex
*3: Drum rotational speed at which an image having a line width of 30 μm with a sharp edge, was obtainable.
◎: 5 to 200 rpm
○: 5 to 100 rpm
Δ: 5 rpm
X: Impossible to form an image at 5 rpm
*4: ○: No background staining observed
*5: ○: No peeling of the image from the support observed
X: Peeling of the image from the support observed
*6: Image property after being left for one day under white light.
○: Same as before being left to stand
X: Image residue was observed at the non-image portion after development
*7: Image property after storage for 2 months at 25° C. under a light-shielding condition
○: Same as before the storage
X: The sensitivity decreased to a level of not higher than ½
*1: R-11: Phthalocyanine type dye
In the brackets ( ), the central metal is indicated.
CY-10: Cyanine type dye
IR-820B: Polymethine dye

EXAMPLE 22

An aluminum plate (size: 500 mm×500 mm, thickness: 0.24 mm) having grain treatment and anodizing treatment applied thereto, was used as a support. On the surface of the aluminum plate support, the following photosensitive composition coating liquid was coated by a wire bar and dried at 70° C. for 2 minutes to form a photosensitive composition layer having a thickness of 1 μm, and further, a 10 wt % aqueous solution of a polyvinyl alcohol/vinyl acetate copolymer (copolymerization molar ratio: 7/3) was coated thereon by a wire bar and dried to form a protective layer having a thickness of 1 μm, thereby to obtain a photosensitive lithographic printing plate.

Photosensitive Composition Coating Liquid

|  | (parts by weight) |
|---|---|
| Urethaneacrylate ("UA-306H", manufactured by Kyoei K.K.) which is reaction product of hexamethylene diisocyanate with pentaerythritol triacrylate | 100 |
| Phthalocyanine type infrared absorbing dye of the above-mentioned R-12 | 5 |
| Organic boron complex of the above-mentioned B-16 | 10 |
| Reaction product obtained by reacting 3,4-epoxycyclohexylmethyl acrylate to a styrene/acrylic acid copolymer (weight average molecular weight: 5,000, acid value: 200) (acid value 80, 50 mol % of carboxy groups of the acrylic acid component was reacted) | 100 |
| Cylonexanone | 180 |

The obtained photosensitive lithographic printing plate was subjected to scanning exposure by means of an exposure apparatus using a semiconductor laser having wavelength of 830 nm as a light source ("Trend Setter 3244T", manufactured by Creo Co.) with a beam spot diameter of 15 μm with various exposure energies of not, higher than 500 mj/cm², and then developed by immersing it in a 1 wt % sodium carbonate aqueous solution at 25° C. for 30 seconds, to form a scanning line image, whereby the sensitivity, resolution and safe light property were evaluated by the following methods. The results are shown in Table 6.

Sensitivity

The sensitivity was evaluated by the minimum exposure energy whereby a proper image was formed.

Resolution

The obtained image was observed by a microscope with 100 magnifications, and it was evaluated on the basis that one wherein scanning lines of 15 μm and spaces therebetween, were sharply formed, was regarded "good", and one wherein the scanning lines and spaces therebetween were not sharply formed, was regarded as "bad".

Safe Light Property

The above photosensitive lithographic printing plate was left to stand for 30 minutes under irradiation with light intensity of 400 lux of a white fluorescent lamp (36W white fluorescent lamp "Neolumi Super FLR 40S-W/M/36", manufactured by Mitsubishi Denki K.K.), and then subjected to the same exposure and development treatment as described above, whereby development failure, fogging, etc., were observed. When compared with a case where exposure and development treatments were carried out without leaving the printing plate under a white fluorescent lamp, one wherein no change was observed, was regarded as "good", and one wherein a change was observed, was regarded as "bad".

EXAMPLES 23 to 27 and COMPARATIVE EXAMPLES 13 to 14

A photosensitive lithographic printing plate was prepred and subjected to exposure and development treatments in the same manner as in Example 22 except that the phthalocyanine type infrared absorbing dye was changed to one identified in Table 6, whereby the sensitivity, resolution and safe light property were evaluated. The results are shown in Table 6.

TABLE 6

| | Sensitizing dye | Sensitivity (mj/cm²) | Resolution | Safe light property |
|---|---|---|---|---|
| Ex. 22 | R-12 (Sn) | 100 | Good | Good |
| Ex. 23 | R-13 (Sn) | 100 | Good | Good |
| Ex. 24 | R-14 (Sn) | 150 | Good | Good |
| Ex. 25 | R-16 (Sn) | 150 | Good | Good |
| Ex. 26 | R-11 (Zn) | 300 | Good | Good |
| Ex. 27 | R-17 (Zn) | 300 | Good | Good |
| Comp. Ex. 13 | Dithiol metal complex type | Impossible to form an image | — | — |
| Comp. Ex. 14 | Cyanine type | Impossible to form an image | — | — |

*R-11, R-12, R-13, R-14, R-16, R-17: Phthalocyanine dyes in the brackets ( ), the central metal is indicated.

The "dithiol metal complex type" used in Comparative Example 3 as a sensitizing dye in Table 6, was "MIR-101" manufactured by Midori Kagaku K.K., and "cyanine type" used in Comparative Example 14, was "CY-10", manufactured by Nippon Kayaku K.K.

As described in the foregoing, the photosensitive composition of the present invention has a high photosensitive property to infrared light and is accordingly capable of forming an image without masking, by exposure with e.g. a semiconductor laser. The image formation can be carried out with an aqueous alkaline solution which is less hazardous and less dangerous. Further, it provides a merit that such operations can be made in a bright environment under white light such as usual fluorescent light instead of a dark room such as red light.

What is claimed is:

1. A photosensitive composition, comprising (a) an ethylenically unsaturated double bond-containing compound, (b) a sensitizing dye and (c) a photopolymerization initiator, wherein the sensitizing dye is a phthalocyanine compound having a maximum absorption within a range of from 750 to 1,200 nm.

2. The photosensitive composition according to claim 1, wherein the sensitizing dye is a phthalocyanine compound at least one aromatic ring of which has a substituent; and wherein said substituent is selected from the group consisting of —SiMe₃, —SiMe₂Ph, —C₅H₁₁, —OBu, —OC₈H₁₇, —OPh, —OCH₂CH₂Ph, —SC₅H₁₁, —SPh, —CH₂OC₅H₁₁, —SCF₂H, —SPh, —F, —OMe,

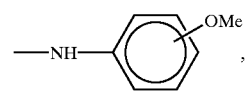

and —NHCOC₁₁H₂₃, wherein
Me is methyl, and Ph is phenyl; and
wherein said photosensitive composition is soluble in an organic solvent.

3. The photosensitive composition according to claim 2, wherein phtalocyanine compound has a molar extinction coefficient of at least 10,000 at the maximum absorption.

4. The photosensitive composition according to claim 2, wherein the phthalocyanine compound is a phthalocyanine compound having zinc or tin as a central metal.

5. The photosensitive composition according to claim 2, wherein said substituent on said aromatic ring is selected from the group consisting of —SiMe$_3$, —SiMe$_2$Ph, —SPh, —SCF$_2$H, —F, and

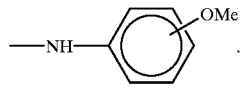

6. The photosensitive composition according to claim 1, wherein the photapolymerization initiator is an organic boron complex or a halomethyl group-containing compound.

7. The photosensitive composition according to claim 6, wherein the photopolymerization initiator is an organic boron complex.

8. The photosensitive composition according to claim 7, wherein the organic boron complex has a maximum absorption wavelength of at most 400 nm.

9. The photosensitive composition according to claim 7, wherein the photopolymerization initiator is an organic boron complex of the following formula (VII):

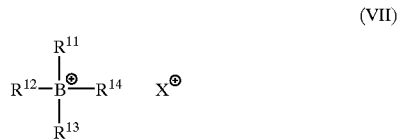

wherein each of $R^{11}$ to $K^{14}$ which are independent of one another, is an alkyl, aryl, aralkyl, alkylaryl, alkenyl. alkynyl, alicyclic or heterocyclic group which is optionally substituted, or $R^{11}$ to $R^{14}$ are bonded to each other to form a cyclic structure, and $X^+$ is a counter cation.

10. The photosensitive composition according to claim 9, wherein among $R^{11}$ to $R^{14}$ in the formula (VII), three are aryl groups which are optionally substituted, and one is an alkyl group which is optionally substituted.

11. The photosensitive composition according to claim 1, which further contains an alkali-soluble resin.

12. The photosensitive composition according to claim 11, wherein the alkali-soluble resin is a rosin having carboxyl groups.

13. The photosensitive composition according to claim 11, wherein the alkali-soluble resin is a (meth)acryl copolymer.

14. The photosensitive composition according to claim 11, wherein the alkali-soluble resin is a resin having an ethylenically unsaturated double bond in its side chain.

15. The photosensitive composition according to claim 1, wherein the ethylenically unsaturated double bond-containing compound is a (meth)acryl monomer.

16. The photosensitive composition according to claim 1, wherein the ethylenically unsaturated double bond-containing compound is a (meth)aoryl monomer having at least 4 double bonds.

17. The photosensitive composition according to claim 15, wherein the (meth)acryl monomer is selected from the group consisting of an ester (meth)acrylatc, an epoxy (meth)acrylatc, a urethane (meth)acrylate, a (meth)acryloyloxyalkyl group-containing amine compound and a (meth)acryloyloxyalkyl group-containing phosphate.

18. An image-forming material comprising a substrate and a photosensitive layer comprising the photosensitive composition of claim 1.

19. A method of forming an image, which comprises subjecting the image-forming material of claim 18, to exposure with an infrared laser having a wavelength within a range of from 780 to 1,200 nm, and then effecting development with an alkali developer to remove unexposed portions.

20. A photosensitive lithographic printing plate, comprising an aluminum support treated by surface roughening and anodic oxidation, the aluminum support being coated with a photosensitive composition comprising:

a) an ethylenically unsaturated double bond-containing compound;

b) a phthalocyanine compound sensitizing dye having a maximum absorption within a range of from 750 to 1,200 nm; and c) a photopolymerization initiator.

21. The photosensitive lithographic printing plate of claim 20, wherein the aluminum support has a centerline average surface roughness (Ra) within a range of from 0.1 to 12 µm.

22. A method of forming an image with a lithographic printing plate, which comprises subjecting the photosensitive lithographic printing plate of claim 20, to exposure with an infrared laser having a wavelength within a range of from 780 to 1,200 nm, then effecting development with an alkali developer to remove unexposed portions.

* * * * *